(12) United States Patent
Koyama

(10) Patent No.: US 9,030,105 B2
(45) Date of Patent: May 12, 2015

(54) LIGHT-EMITTING DEVICE

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 519 days.

(21) Appl. No.: 13/431,447

(22) Filed: Mar. 27, 2012

(65) Prior Publication Data

US 2012/0248435 A1  Oct. 4, 2012

(30) Foreign Application Priority Data

Apr. 1, 2011 (JP) ................. 2011-081923
Apr. 1, 2011 (JP) ................. 2011-081928
May 13, 2011 (JP) ................. 2011-108587
May 13, 2011 (JP) ................. 2011-108610

(51) Int. Cl.
*G09G 3/10* (2006.01)
*G09G 3/30* (2006.01)
*H01L 27/12* (2006.01)
(Continued)

(52) U.S. Cl.
CPC ........ *H01L 27/1225* (2013.01); *H01L 27/1255* (2013.01); *H01L 27/3206* (2013.01); *H01L 27/322* (2013.01); *H01L 27/3262* (2013.01); *H01L 51/506* (2013.01); *H01L 51/5218* (2013.01); *H01L 51/5265* (2013.01); *G09G 2300/0852* (2013.01); *G09G 2300/0861* (2013.01); *G09G 2320/045* (2013.01)

(58) Field of Classification Search
USPC .................. 315/169.1–169.3; 345/76–84
See application file for complete search history.

(56) References Cited

U.S. PATENT DOCUMENTS 5,684,365 A  11/1997 Tang et al.
5,731,856 A   3/1998 Kim et al.
(Continued)

FOREIGN PATENT DOCUMENTS

CN    1799081 A    7/2006
EP  0 717 446 A2   6/1996
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Jimmy Vu
(74) *Attorney, Agent, or Firm* — Fish & Richardson P.C.

(57) ABSTRACT

A light-emitting device according to one embodiment of the present invention includes a light-emitting element, a first transistor whose source is electrically connected to an anode of the light-emitting element, a second transistor which controls whether an image signal is input to a gate of the first transistor, a third transistor which controls electrical connection and disconnection between the gate and a drain of the first transistor, a fourth transistor which controls whether a first power supply potential is supplied to the drain of the first transistor, a fifth transistor which controls whether a second power supply potential is supplied to the anode of the light-emitting element, a first capacitor which holds a voltage between the gate and the source of the first transistor, and a second capacitor electrically connected in series with the first capacitor and electrically connected in series with the light-emitting element.

19 Claims, 31 Drawing Sheets

(51) Int. Cl.
  *H01L 27/32* (2006.01)
  *H01L 51/50* (2006.01)
  *H01L 51/52* (2006.01)

(56) References Cited

U.S. PATENT DOCUMENTS

| | | | |
|---|---|---|---|
| 5,744,864 A | 4/1998 | Cillessen et al. | |
| 5,956,011 A | 9/1999 | Koyama et al. | |
| 6,037,924 A | 3/2000 | Koyama et al. | |
| 6,229,506 B1 | 5/2001 | Dawson et al. | |
| 6,294,274 B1 | 9/2001 | Kawazoe et al. | |
| 6,310,598 B1 | 10/2001 | Koyama et al. | |
| 6,362,798 B1 | 3/2002 | Kimura et al. | |
| 6,518,945 B1 | 2/2003 | Pinkham | |
| 6,563,174 B2 | 5/2003 | Kawasaki et al. | |
| 6,577,302 B2 | 6/2003 | Hunter et al. | |
| 6,608,613 B2 | 8/2003 | Koyama et al. | |
| 6,611,130 B2 | 8/2003 | Chang | |
| 6,709,901 B1 | 3/2004 | Yamazaki et al. | |
| 6,727,522 B1 | 4/2004 | Kawasaki et al. | |
| 6,768,348 B2 | 7/2004 | Shionoiri et al. | |
| 6,858,989 B2 | 2/2005 | Howard | |
| 7,042,162 B2 | 5/2006 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,068,246 B2 | 6/2006 | Yamazaki et al. | |
| 7,091,750 B2 | 8/2006 | Shionoiri et al. | |
| 7,105,868 B2 | 9/2006 | Nause et al. | |
| 7,129,917 B2 | 10/2006 | Yamazaki et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,317,429 B2 | 1/2008 | Shirasaki et al. | |
| 7,323,356 B2 | 1/2008 | Hosono et al. | |
| 7,327,168 B2 | 2/2008 | Kimura | |
| 7,362,289 B2 | 4/2008 | Yamazaki et al. | |
| 7,365,713 B2 | 4/2008 | Kimura | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,429,985 B2 | 9/2008 | Kimura et al. | |
| 7,453,065 B2 | 11/2008 | Saito et al. | |
| 7,453,087 B2 | 11/2008 | Iwasaki | |
| 7,456,810 B2 | 11/2008 | Kimura | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,515,121 B2 | 4/2009 | Sato et al. | |
| 7,518,580 B2 | 4/2009 | Kwon | |
| 7,528,643 B2 | 5/2009 | Kimura | |
| 7,671,826 B2 | 3/2010 | Kimura | |
| 7,674,650 B2 | 3/2010 | Akimoto et al. | |
| 7,679,585 B2 | 3/2010 | Kimura | |
| 7,679,587 B2 | 3/2010 | Kwak | |
| 7,710,368 B2 | 5/2010 | Chung | |
| 7,714,813 B2 | 5/2010 | Uchino et al. | |
| 7,732,819 B2 | 6/2010 | Akimoto et al. | |
| 7,800,565 B2 | 9/2010 | Nathan et al. | |
| 7,817,117 B2 | 10/2010 | Kimura | |
| 7,924,244 B2 | 4/2011 | Kimura et al. | |
| 7,965,106 B2 | 6/2011 | Kimura | |
| 7,982,696 B2 | 7/2011 | Kimura | |
| 8,004,477 B2 | 8/2011 | Uchino et al. | |
| 8,059,068 B2 | 11/2011 | Kimura | |
| 8,063,859 B2 | 11/2011 | Kimura | |
| 8,368,618 B2 * | 2/2013 | Choi | 345/76 |
| 2001/0043168 A1 | 11/2001 | Koyama et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0090481 A1 | 5/2003 | Kimura | |
| 2003/0095087 A1 | 5/2003 | Libsch et al. | |
| 2003/0103022 A1 | 6/2003 | Noguchi et al. | |
| 2003/0112208 A1 | 6/2003 | Okabe et al. | |
| 2003/0117352 A1 | 6/2003 | Kimura | |
| 2003/0132931 A1 | 7/2003 | Kimura et al. | |
| 2003/0137503 A1 | 7/2003 | Kimura et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0070557 A1 | 4/2004 | Asano et al. | |
| 2004/0080474 A1 | 4/2004 | Kimura | |
| 2004/0127038 A1 | 7/2004 | Carcia et al. | |
| 2004/0174349 A1 | 9/2004 | Libsch et al. | |
| 2004/0174354 A1 | 9/2004 | Ono et al. | |
| 2004/0207614 A1 | 10/2004 | Yamashita et al. | |
| 2005/0017302 A1 | 1/2005 | Hoffman | |
| 2005/0057459 A1 | 3/2005 | Miyazawa | |
| 2005/0083270 A1 | 4/2005 | Miyazawa | |
| 2005/0199959 A1 | 9/2005 | Chiang et al. | |
| 2005/0200618 A1 | 9/2005 | Kim et al. | |
| 2005/0206593 A1 | 9/2005 | Kwon | |
| 2005/0237273 A1 | 10/2005 | Ozawa et al. | |
| 2005/0259051 A1 | 11/2005 | Lee et al. | |
| 2005/0269959 A1 | 12/2005 | Uchino et al. | |
| 2006/0035452 A1 | 2/2006 | Carcia et al. | |
| 2006/0043377 A1 | 3/2006 | Hoffman et al. | |
| 2006/0066532 A1 * | 3/2006 | Jeong | 345/76 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0156121 A1 | 7/2006 | Chung | |
| 2006/0169973 A1 | 8/2006 | Isa et al. | |
| 2006/0170111 A1 | 8/2006 | Isa et al. | |
| 2006/0170628 A1 | 8/2006 | Yamashita et al. | |
| 2006/0176250 A1 | 8/2006 | Nathan et al. | |
| 2006/0197092 A1 | 9/2006 | Hoffman et al. | |
| 2006/0208977 A1 | 9/2006 | Kimura | |
| 2006/0221005 A1 | 10/2006 | Omata et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0238461 A1 | 10/2006 | Goh et al. | |
| 2006/0244107 A1 | 11/2006 | Sugihara et al. | |
| 2006/0255837 A1 | 11/2006 | Shionoiri et al. | |
| 2006/0279499 A1 | 12/2006 | Park et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0002084 A1 | 1/2007 | Kimura et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0063993 A1 | 3/2007 | Shishido | |
| 2007/0064469 A1 | 3/2007 | Umezaki | |
| 2007/0085847 A1 | 4/2007 | Shishido | |
| 2007/0090365 A1 | 4/2007 | Hayashi et al. | |
| 2007/0103419 A1 | 5/2007 | Uchino et al. | |
| 2007/0108446 A1 | 5/2007 | Akimoto | |
| 2007/0115225 A1 | 5/2007 | Uchino et al. | |
| 2007/0120785 A1 | 5/2007 | Kimura | |
| 2007/0120795 A1 | 5/2007 | Uchino et al. | |
| 2007/0126664 A1 | 6/2007 | Kimura | |
| 2007/0126665 A1 | 6/2007 | Kimura | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0200793 A1 | 8/2007 | Kwon | |
| 2007/0236424 A1 | 10/2007 | Kimura | |
| 2007/0247398 A1 | 10/2007 | Nathan et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |

(56) References Cited

U.S. PATENT DOCUMENTS

| | | |
|---|---|---|
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1 | 9/2008 | Kimura et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284312 A1 | 11/2008 | Kimura |
| 2008/0296568 A1 | 12/2008 | Ryu et al. |
| 2009/0009676 A1 | 1/2009 | Kimura et al. |
| 2009/0051674 A1 | 2/2009 | Kimura et al. |
| 2009/0068773 A1 | 3/2009 | Lai et al. |
| 2009/0073325 A1 | 3/2009 | Kuwabara et al. |
| 2009/0096727 A1 | 4/2009 | Kimura |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167404 A1 | 7/2009 | Kimura |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0079357 A1 | 4/2010 | Ozawa et al. |
| 2010/0092800 A1 | 4/2010 | Itagaki et al. |
| 2010/0109002 A1 | 5/2010 | Itagaki et al. |
| 2010/0149160 A1 | 6/2010 | Kimura |
| 2010/0156877 A1 | 6/2010 | Kimura |
| 2010/0220117 A1 | 9/2010 | Kimura |
| 2011/0115758 A1 | 5/2011 | Kimura et al. |
| 2011/0205144 A1 | 8/2011 | Kimura et al. |
| 2011/0205215 A1 | 8/2011 | Kimura |
| 2011/0248746 A1 | 10/2011 | Kimura |
| 2011/0260170 A1 | 10/2011 | Kimura |

FOREIGN PATENT DOCUMENTS

| | | |
|---|---|---|
| EP | 1 632 930 A1 | 3/2006 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-234683 A | 9/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-195810 A | 7/2003 |
| JP | 2004-103957 A | 4/2004 |
| JP | 2004-273614 A | 9/2004 |
| JP | 2004-273732 A | 9/2004 |
| JP | 2004-280059 A | 10/2004 |
| JP | 2004-295131 A | 10/2004 |
| JP | 2005-189643 A | 7/2005 |
| JP | 2006-215275 A | 8/2006 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FDP '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Charachteristics and Electronic Structure for Amorphous In—Ga—Zn—Oxide TFT," AM-FPD '09 Digest of Technical Papers, Jul. 1, 2009, pp. 41-44.

Hayashi, R et al. "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al.. "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and

(56) References Cited

OTHER PUBLICATIONS

Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

(56) References Cited

OTHER PUBLICATIONS

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

J.H. Jung et al.; "49.1 : A 14.1 inch Full Color AMOLED Display with Top Emission Structure and a-Si TFT Backplane"; SID Digest '05 : SID International Symposium Digest of Technical Papers; 2005; pp. 1538-1541; vol. 36.

European Search Report (European Patent Application No. 07020230.4) dated Aug. 3, 2010.

Office Action (Chinese Patent Application No. 200710167938.2) dated Aug. 25, 2010 with English language translation.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center with English language translation.

\* cited by examiner

FIG. 2A  T11
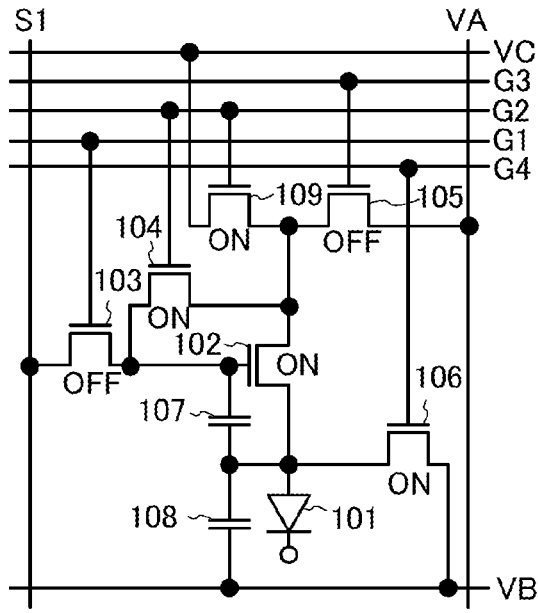
FIG. 2B  T12
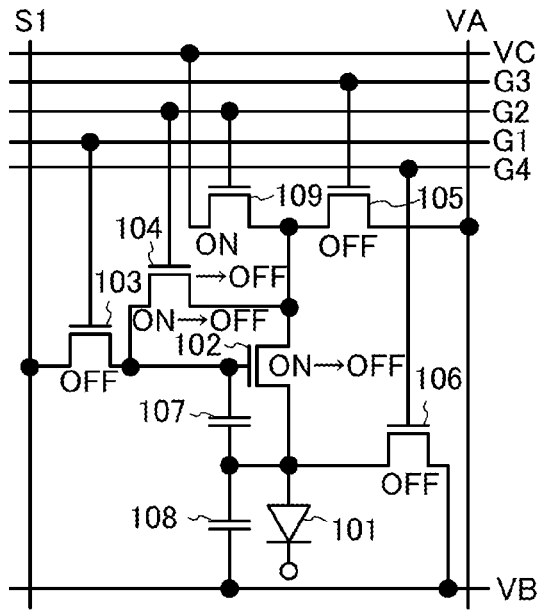

FIG. 16A
FIG. 16B
FIG. 16C
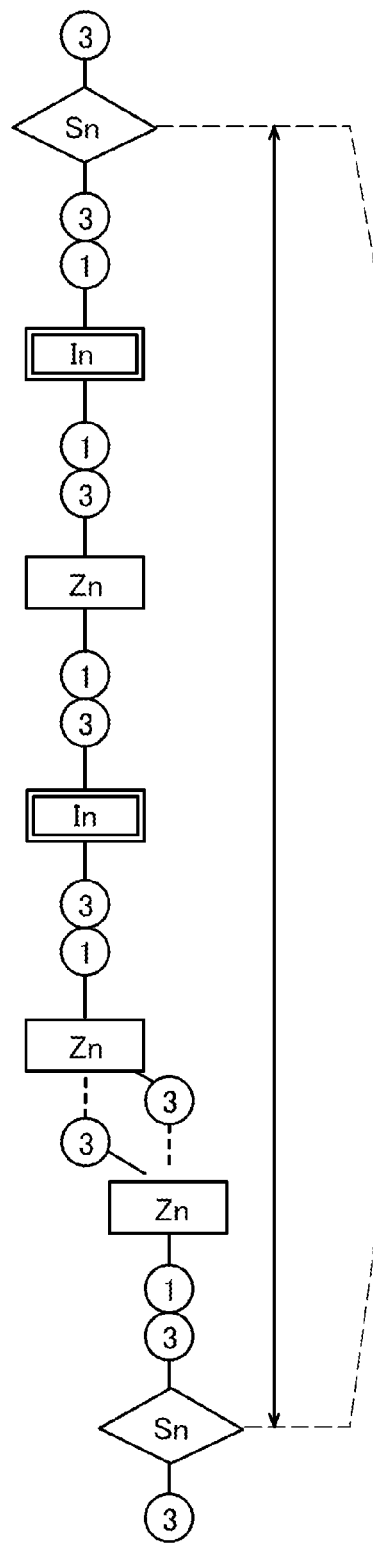
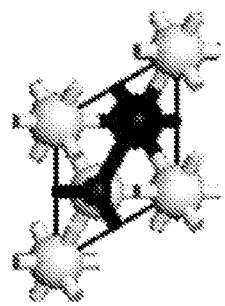
● In
☾ Sn
☾ Zn
● O

- In
- Ga
- Zn
- O

LIGHT-EMITTING DEVICE

BACKGROUND OF THE INVENTION

1. Field of the Invention

The present invention relates to a light-emitting device in which a transistor is provided in each pixel.

2. Description of the Related Art

Because display devices using light-emitting elements have high visibility, is suitable for reduction in thickness, and do not have limitations on viewing angles, they have attracted attention as an alternative to CRTs (cathode ray tubes) or liquid crystal display devices. Specific structures of active matrix display devices using light-emitting elements differ depending on manufacturers. In general, at least a light-emitting element, a transistor (switching transistor) which controls input of a video signal to a pixel, and a transistor (driving transistor) which controls the amount of current supplied to the light-emitting element are provided in each pixel.

When all the transistors in the pixels have the same polarity, it is possible to omit some of steps for manufacturing the transistors, e.g., a step of adding an impurity element imparting one conductivity type to a semiconductor layer. Patent Document 1 discloses a light-emitting element type display in which transistors included in pixels are all n-channel transistors.

REFERENCE

Patent Document

[Patent Document 1] Japanese Published Patent Application No. 2003-195810

SUMMARY OF THE INVENTION

In a light-emitting device, drain current of a driving transistor is supplied to a light-emitting element; thus, when the threshold voltages of driving transistors vary among pixels, the luminances of light-emitting elements vary correspondingly. Therefore, in order to improve the image quality of a light-emitting device, it is an important object to propose a pixel structure in which a current value of a driving transistor can be corrected in anticipation of variation in threshold voltage.

In general, a surface of a conductive film which is used as an anode of a light-emitting element is less likely to be oxidized in the air than that of a conductive film which is used as a cathode of a light-emitting element. In addition, because a conductive film which is used as an anode of a light-emitting element is generally formed by a sputtering method, when the anode is formed over an electroluminescent layer containing an electroluminescent material, the electroluminescent layer tends to be damaged by sputtering. In view of the above, a light-emitting element in which an anode, an electroluminescent layer, and a cathode are stacked in this order can be manufactured through an easy process and can easily achieve high emission efficiency. However, when an n-channel driving transistor is used in combination with the above light-emitting element, a source of the driving transistor is connected to the anode of the light-emitting element. In that case, when the voltage between the anode and the cathode of the light-emitting element is increased owing to deterioration of an electroluminescent material, the potential of the source of the driving transistor is increased, whereby the voltage between a gate and the source (gate voltage) of the driving transistor is decreased. Accordingly, drain current of the driving transistor, that is, current supplied to the light-emitting element is decreased, resulting in a decrease in luminance of the light-emitting element.

In view of the above problem, an object of one embodiment of the present invention is to provide a light-emitting device in which variation in luminance among pixels caused by variation in threshold voltage of driving transistors can be suppressed. Another object of one embodiment of the present invention is to provide a light-emitting device in which a decrease in luminance of a light-emitting element caused by deterioration of an electroluminescent layer can be suppressed.

In one embodiment of the present invention, in order to achieve the above object, a first capacitor which holds the voltage between a gate and a source of a driving transistor and a second capacitor which is connected in series with the first capacitor and connected in series with a light-emitting element are provided in a pixel. The capacitance of the first capacitor is set smaller than the total capacitance of the light-emitting element and the second capacitor. In the above pixel, a voltage higher than the threshold voltage is applied between the gate and the source of the driving transistor with the gate and a drain of the driving transistor connected to each other. Next, the source is brought into a floating state while the gate and the drain are kept connected, so that the threshold voltage of the driving transistor is held in the first capacitor. Then, when the voltage of an image signal is applied to the gate with the source kept in a floating state, a voltage which is the sum of the voltage of the image signal and the threshold voltage is applied between the gate and the source of the driving transistor. The light-emitting element is supplied with current corresponding to the gate voltage of the driving transistor, and thereby expresses gray levels.

With the above structure, in one embodiment of the present invention, even when the threshold voltage of the driving transistor is shifted, the gate voltage of the driving transistor can be determined in accordance with the threshold voltage. Further, in one embodiment of the present invention, the gate voltage of the driving transistor is not changed even when the voltage between the anode and the cathode of the light-emitting element is increased owing to deterioration of an electroluminescent material.

Specifically, a light-emitting device according to one embodiment of the present invention includes a light-emitting element, a first transistor whose source is electrically connected to an anode of the light-emitting element and which controls a current supplied to the light-emitting element, a second transistor which controls whether an image signal is input to a gate of the first transistor, a third transistor which controls electrical connection and disconnection between the gate and a drain of the first transistor, a fourth transistor which controls whether a first power supply potential is supplied to the drain of the first transistor, a fifth transistor which controls whether a second power supply potential is supplied to the anode of the light-emitting element, a first capacitor which holds a voltage between the gate and the source of the first transistor, and a second capacitor electrically connected in series with the first capacitor and electrically connected in series with the light-emitting element. The first to fifth transistors are n-channel transistors.

The light-emitting device according to one embodiment of the present invention may further include a sixth transistor which controls whether the second power supply potential is supplied to a drain of the second transistor.

In the light-emitting device according to one embodiment of the present invention, an oxide semiconductor or single crystal silicon may be used for a channel formation region provided between a source and a drain in each of the first to sixth transistors.

With the above structure, in one embodiment of the present invention, variation in luminance among pixels caused by variation in threshold voltage of driving transistors can be suppressed. Further, in one embodiment of the present invention, a decrease in luminance of a light-emitting element caused by deterioration of an electroluminescent layer can be suppressed.

BRIEF DESCRIPTION OF THE DRAWINGS

FIGS. 2A and 2B illustrate a method for driving a light-emitting device.

FIGS. 16A to 16C illustrate a structure of an oxide material.

DETAILED DESCRIPTION OF THE INVENTION

Hereinafter, embodiments and examples of the present invention will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description of embodiments and examples below.

Embodiment 1

A light-emitting device in this embodiment includes a pixel portion. An example of the pixel portion in the light-emitting device in this embodiment will be described with reference to FIGS. 1A and 1B.

Figure 1A:
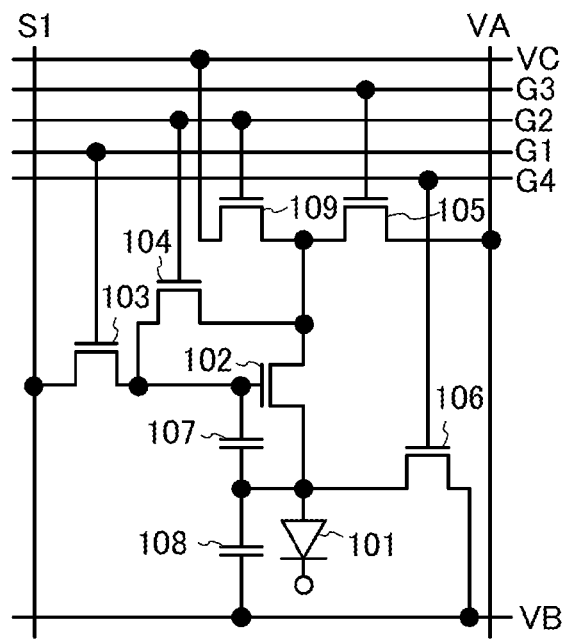
FIGS. 1A and 1B are a circuit diagram and a timing chart of a pixel portion in a light-emitting device.

As illustrated in FIG. 1A, the pixel portion includes a signal line S1, a power supply line VA, a power supply line VB, a power supply line VC, a scan line G1, a scan line G2, a scan line G3, a scan line G4, a light-emitting element 101, a transistor 102, a transistor 103, a transistor 104, a transistor 105, a transistor 106, a capacitor 107, a capacitor 108, and a transistor 109.

In the light-emitting device in FIG. 1A, the transistors are field-effect transistors. A source and a drain of each transistor are interchanged in some cases depending on a structure or operation conditions of the transistor.

For example, one pixel may be constituted by one pixel circuit including the light-emitting element 101, the transistor 102, the transistor 103, the transistor 104, the transistor 105, the transistor 106, the capacitor 107, the capacitor 108, and the transistor 109. A plurality of pixel circuits is arranged in a matrix in the pixel portion. Alternatively, one pixel may be constituted by two or more pixel circuits. In that case, the pixel circuits in each pixel are also called sub-pixels.

The light-emitting element 101 includes an anode and a cathode, and emits light with a luminance corresponding to the amount of current which flows between the anode and the cathode. Thus, the light-emitting element 101 can express gray levels.

An electroluminescent element, a light-emitting diode, or the like can be used as the light-emitting element 101. For example, the light-emitting element 101 can have a structure in which an electroluminescent layer containing an electroluminescent material is provided between a conductive film used as the anode and a conductive film used as the cathode.

A source of the transistor 102 is electrically connected to the anode of the light-emitting element 101. The transistor 102 functions as a driving transistor which controls current flowing through the light-emitting element 101.

One of a source and a drain of the transistor 103 is electrically connected to the signal line S1, and the other of the source and the drain of the transistor 103 is electrically connected to a gate of the transistor 102. The signal line S1 is a wiring through which an image signal (video signal) is supplied. In FIG. 1A, a gate of the transistor 103 is electrically connected to the scan line G1. The scan line G1 is a wiring through which a scan signal SCN1 is supplied. The transistor 103 is turned on or off in accordance with the scan signal SCN1. The transistor 103 functions as a switching transistor which controls whether an image signal is input to the gate of the transistor 102.

One of a source and a drain of the transistor 104 is electrically connected to a drain of the transistor 102, and the other of the source and the drain of the transistor 104 is electrically connected to the gate of the transistor 102. In FIG. 1A, a gate of the transistor 104 is electrically connected to the scan line G2. The scan line G2 is a wiring through which a scan signal SCN2 is supplied. The transistor 104 is turned on or off in accordance with the scan signal SCN2. The transistor 104 has a function of controlling whether the gate and the drain of the transistor 102 are electrically connected to each other.

One of a source and a drain of the transistor 105 is electrically connected to the power supply line VA, and the other of the source and the drain of the transistor 105 is electrically connected to the drain of the transistor 102. The power supply line VA is a wiring through which a power supply potential V1 is supplied, and the power supply potential V1 is higher than a reference potential (e.g., a ground potential). In FIG. 1A, a gate of the transistor 105 is electrically connected to the scan line G3. The scan line G3 is a wiring through which a scan signal SCN3 is supplied. The transistor 105 is turned on or off in accordance with the scan signal SCN3. The transistor 105 has a function of controlling whether the power supply potential V1 is supplied to the drain of the transistor 102.

One of a source and a drain of the transistor 106 is electrically connected to the power supply line VB, and the other of the source and the drain of the transistor 106 is electrically connected to the anode of the light-emitting element 101. The power supply line VB is a wiring through which a power supply potential V2 is supplied, and the power supply potential V2 is lower than the reference potential. In FIG. 1A, a gate of the transistor 106 is electrically connected to the scan line G4. The scan line G4 is a wiring through which a scan signal SCN4 is supplied. The transistor 106 is turned on or off in accordance with the scan signal SCN4. The transistor 106 has a function of controlling whether the power supply potential V2 is supplied to the anode of the light-emitting element 101. When the voltage of the cathode of the light-emitting element 101 is set higher than the power supply potential V2, the amount of current flowing through the light-emitting element 101 can be reduced, for example, in an initialization period.

One of a pair of electrodes of the capacitor 107 is electrically connected to the gate of the transistor 102, and the other of the pair of electrodes of the capacitor 107 is electrically connected to the source of the transistor 102. The capacitor 107 has a function of holding the voltage between the gate and the source of the transistor 102.

One of a pair of electrodes of the capacitor 108 is electrically connected to the other of the pair of electrodes of the capacitor 107 and the anode of the light-emitting element 101, and the other of the pair of electrodes of the capacitor 108 is electrically connected to the power supply line VB. The capacitor 108 is electrically connected in series with the capacitor 107 and electrically connected in series with the light-emitting element 101.

The capacitance of the capacitor 107 is preferably smaller than the total capacitance of the light-emitting element 101 and the capacitor 108. In that case, a decrease in voltage between the gate and the source of the transistor 102 due to the capacitance of the light-emitting element 101 can be suppressed.

One of a source and a drain of the transistor 109 is electrically connected to the power supply line VC, and the other of the source and the drain of the transistor 109 is electrically connected to the drain of the transistor 102. The power supply line VC is a wiring through which a power supply potential V3 is supplied. The power supply potential V3 is lower than the power supply potential V1, higher than the power supply potential V2, and higher than the potential of the cathode of the light-emitting element 101. Without limitation to this structure, the cathode of the light-emitting element 101 may be electrically connected to the power supply line VC. The potential difference between the power supply potential V3 and the power supply potential V2 is larger than the threshold voltage of the transistor 102. The other of the source and the drain of the transistor 109 may be electrically connected to the gate, instead of the drain, of the transistor 102. In FIG. 1A, a gate of the transistor 109 is electrically connected to the scan line G2, and the transistor 109 is turned on or off in accordance with the scan signal SCN2. The transistor 109 has a function of controlling whether the power supply potential V3 is supplied to the drain of the transistor 102. By the provision of the transistor 109, in the initialization period, the power supply potential V3 which is lower than the power supply potential V1 can be supplied to the gate and the drain of the transistor 102, so that the amount of current flowing between the source and the drain of the transistor 102 can be reduced. Thus, power consumption can be reduced.

As the transistor 102, an n-channel transistor can be used. Further, as each of the transistors 103, 104, 105, 106, and 109, an n-channel transistor or a p-channel transistor can be used. For example, when an n-channel transistor is used as each of the transistors 102, 103, 104, 105, 106, and 109, the number of manufacturing steps can be reduced.

Further, each of the transistors 102, 103, 104, 105, 106, and 109 may be, for example, a transistor in which a wide gap semiconductor such as an oxide semiconductor is used for a channel formation region provided between a source and a drain, or a transistor in which a semiconductor such as silicon or germanium which is amorphous, microcrystalline, polycrystalline, or single crystalline is used for the channel formation region. The transistor including the oxide semiconductor has an off-state current lower than that of a conventional transistor including a semiconductor such as silicon. The oxide semiconductor has a wider band gap and lower intrinsic carrier density than silicon. Therefore, the use of the oxide semiconductor can significantly lower the off-state current of the transistor; the off-state current per micrometer of the channel width of the transistor including the oxide semiconductor is lower than or equal to 10 aA ($1 \times 10^{-17}$ A), preferably lower than or equal to 1 aA ($1 \times 10^{-18}$ A), further preferably lower than or equal to 10 zA ($1 \times 10^{-20}$ A), further preferably lower than or equal to 1 zA ($1 \times 10^{-21}$ A), much further preferably lower than or equal to 100 yA ($1 \times 10^{-22}$ A).

Next, an example of a method for driving the light-emitting device in this embodiment will be described using a timing chart shown in FIG. 1B, and FIGS. 2A and 2B and FIGS. 3A and 3B. Note that in this example, the transistors 102, 103, 104, 105, 106, and 109 are all n-channel transistors. In addition, it is assumed that the capacitance of the capacitor 107 is much smaller than the total capacitance of the light-emitting element 101 and the capacitor 108 such that there is no decrease in voltage between the gate and the source of the transistor 102 due to the total capacitance.

In the example of the method for driving the light-emitting device in this embodiment, the operation of the light-emitting device can be roughly divided into an initialization period T11, a threshold voltage data acquiring period T12, an image signal input period T13, and a display period T14.

Figure 1B:
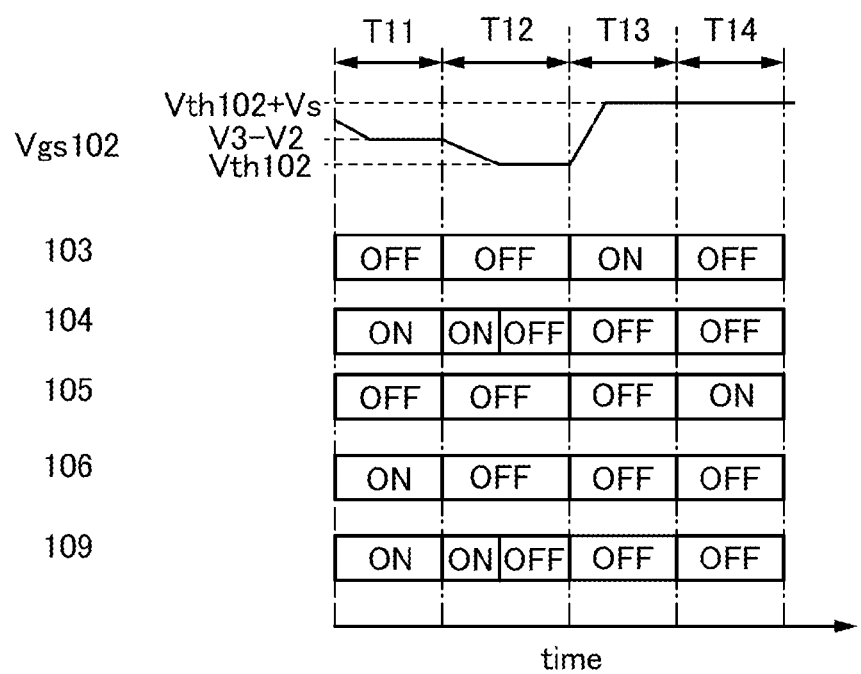

First, in the initialization period T11, the transistors 104, 106, and 109 are turned on as illustrated in FIG. 1B and FIG. 2A.

At this time, the potentials of the gate and the drain of the transistor 102 become the power supply potential V3. Further, the potential of the source of the transistor 102 becomes the power supply potential V2. Thus, the transistor 102 is turned on, and the voltage between the gate and the source of the transistor 102 (voltage Vgs102) becomes a value obtained by subtracting the power supply potential V2 from the power supply potential V3 (V3−V2).

Next, in the threshold voltage data acquiring period T12, the transistor 106 is turned off as illustrated in FIG. 1B and FIG. 2B.

At this time, current flows between the source and the drain of the transistor 102 while the transistor 102 is kept on, whereby the potential of the source of the transistor 102 is increased, and the transistor 102 is turned off at the time when the voltage between the gate and the source of the transistor 102 becomes lower than or equal to the threshold voltage of the transistor 102 (voltage Vth102). Then, the transistors 104 and 109 are turned off, whereby the voltage between the gate and the source of the transistor 102 is held.

Figure 3A:
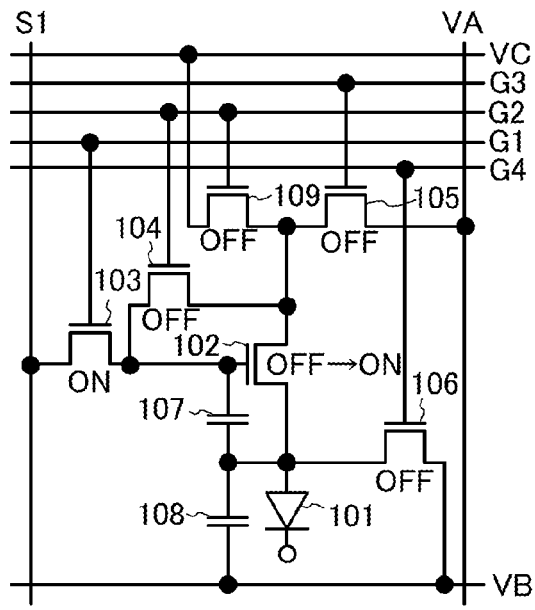
FIGS. 3A and 3B illustrate a method for driving a light-emitting device.

Next, in the image signal input period T13, the transistor 103 is turned on as illustrated in FIG. 1B and FIG. 3A.

At this time, an image signal is input to the gate of the transistor 102, and the potential of the gate of the transistor 102 is changed in accordance with the image signal. At that time, the voltage between the gate and the source of the transistor 102 becomes a value obtained by adding a voltage Vs to the threshold voltage of the transistor 102 (Vth102+Vs). The voltage Vs is determined by the amount of change in the potential of the gate of the transistor 102 based on the image signal. FIG. 3A shows an example where the transistor 102 is turned on.

Figure 3B:
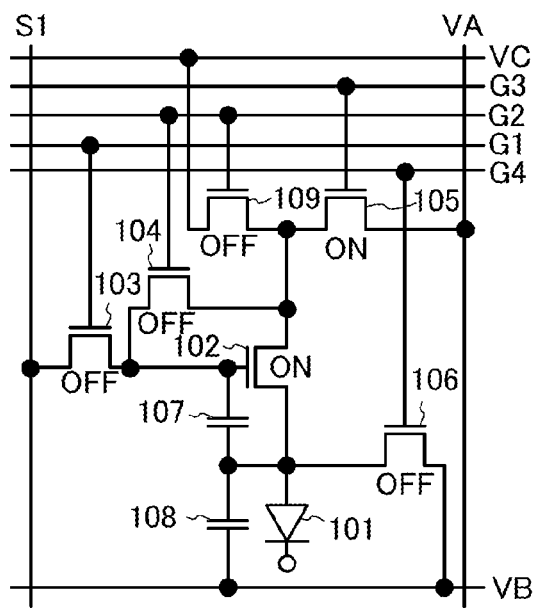

Next, in the display period T14, the transistor 103 is turned off and the transistor 105 is turned on as illustrated in FIG. 1B and FIG. 3B.

At this time, the potential of the drain of the transistor 102 becomes the power supply potential V1, so that current flows between the source and the drain of the transistor 102. Further, current flows between the anode and the cathode of the light-emitting element 101; thus, the light-emitting element 101 emits light. In this manner, a display state is obtained.

In this case, the amount of current which flows through the light-emitting element 101 is determined by the amount of current flowing between the source and the drain of the transistor 102 (Ids102). When the transistor 102 is operated in a saturation region, the amount of current flowing between the source and the drain of the transistor 102 can be expressed by the following Formula (1).

[FORMULA 1]

$$Ids102 = \frac{1}{2}\beta(Vgs102 - Vth102)^2 \quad (1)$$

Here, β is a constant which can be obtained from the mobility, the channel length, the channel width, and the like of the transistor 102.

In the display period T14, the voltage between the gate and the source of the transistor 102 (Vgs102) is Vth102+Vs; the following Formula (2) is obtained when this value is substituted into Formula (1).

[FORMULA 2]

$$Ids102 = \frac{1}{2}\beta(Vth102 + Vs - Vth102)^2 = \frac{1}{2}\beta(Vs)^2 \quad (2)$$

Accordingly, the amount of current flowing between the source and the drain of the transistor 102 (Ids102) is determined in accordance with the image signal, regardless of the threshold voltage of the transistor 102.

All the pixel circuits perform the above operation, whereby an image is displayed in the light-emitting device. Further, the image displayed in the light-emitting device can be rewritten by repetition of the above operation in each pixel circuit.

The above is the example of the method for driving the light-emitting device in this embodiment.

Figure 4:
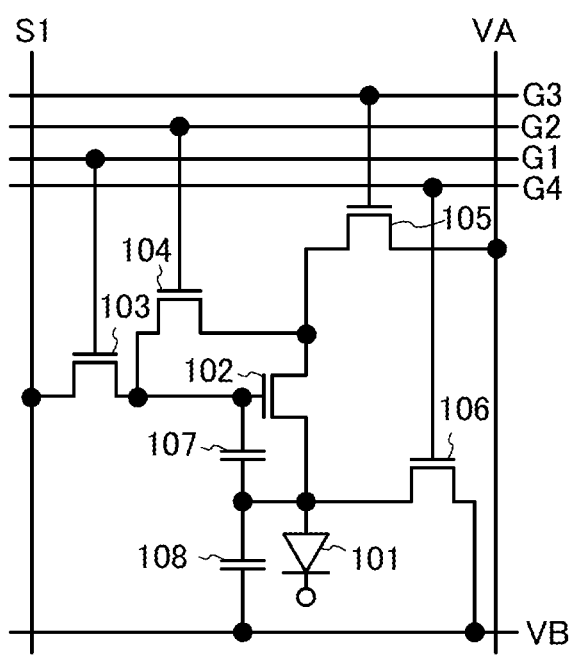
FIG. 4 is a circuit diagram of a pixel portion of in a light-emitting device.

In the light-emitting device in this embodiment, the transistor 109 may be omitted as illustrated in FIG. 4. In that case, in the initialization period T11, the transistor 105 is turned on so that the power supply potential V1 is supplied to the drain of the transistor 102. When a structure without the transistor 109 is employed, the number of transistors can be reduced and thus the circuit area can be reduced.

As described with reference to FIGS. 1A and 1B, FIGS. 2A and 2B, FIGS. 3A and 3B, and FIG. 4, in the light-emitting device in this embodiment, a threshold voltage data acquiring period is provided, and the voltage between the gate and the source of the driving transistor is set to a value corresponding to the threshold voltage of the driving transistor with the use of the capacitor. Thus, in the display period, the amount of current which flows between the source and the drain of the driving transistor can be determined regardless of the threshold voltage of the driving transistor, so that variation in luminance among the pixels caused by variation in threshold voltage of the driving transistors can be suppressed.

Further, in the light-emitting device in this embodiment, a power supply potential for initialization is supplied to the anode of the light-emitting element in the initialization period; thus, a change in the voltage applied between the anode and the cathode of the light-emitting element due to deterioration of the electroluminescent layer in the light-emitting element can be suppressed. Accordingly, a decrease in luminance of the light-emitting element caused by deterioration of the electroluminescent layer can be suppressed.

Further, in the light-emitting device in this embodiment, all the transistors included in the pixel portion are n-channel transistors; thus, the number of manufacturing steps can be reduced.

This embodiment can be implemented in appropriate combination with any of the other embodiments.

Embodiment 2

In this embodiment, a specific structure of a pixel of a light-emitting device according to one embodiment of the present invention will be described.

Figure 5:
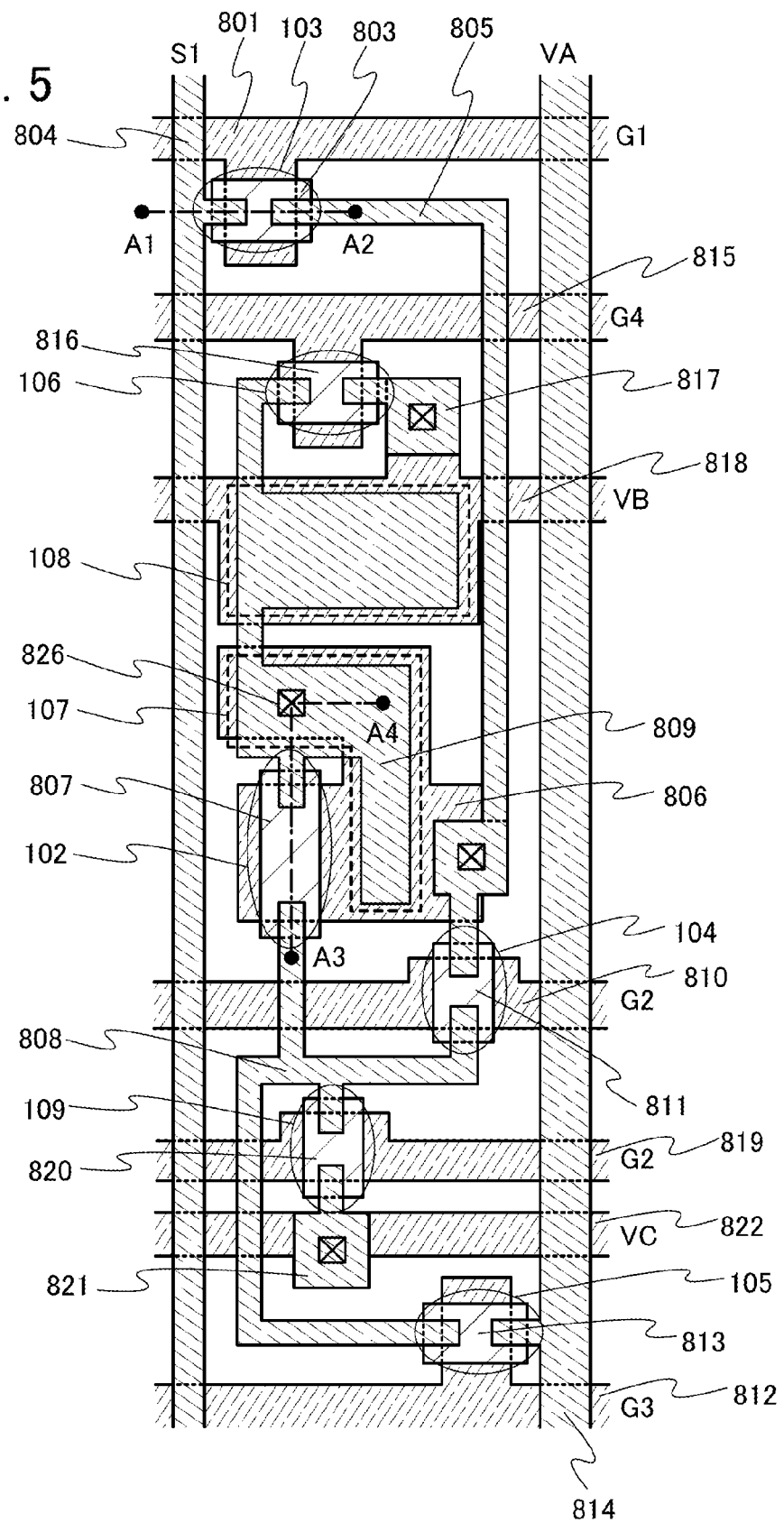
FIG. 5 is a top view of a pixel.

FIG. 5 illustrates an example of a top view of the pixel illustrated in FIG. 1A. Note that in the top view of the pixel in FIG. 5, various insulating films are omitted in order to clearly show the layout of the pixel. Further, in the top view of the pixel in FIG. 5, the anode, the electroluminescent layer, and the cathode are omitted in order to clearly show the layout of the transistors and the capacitors included in the pixel.

Figure 6:
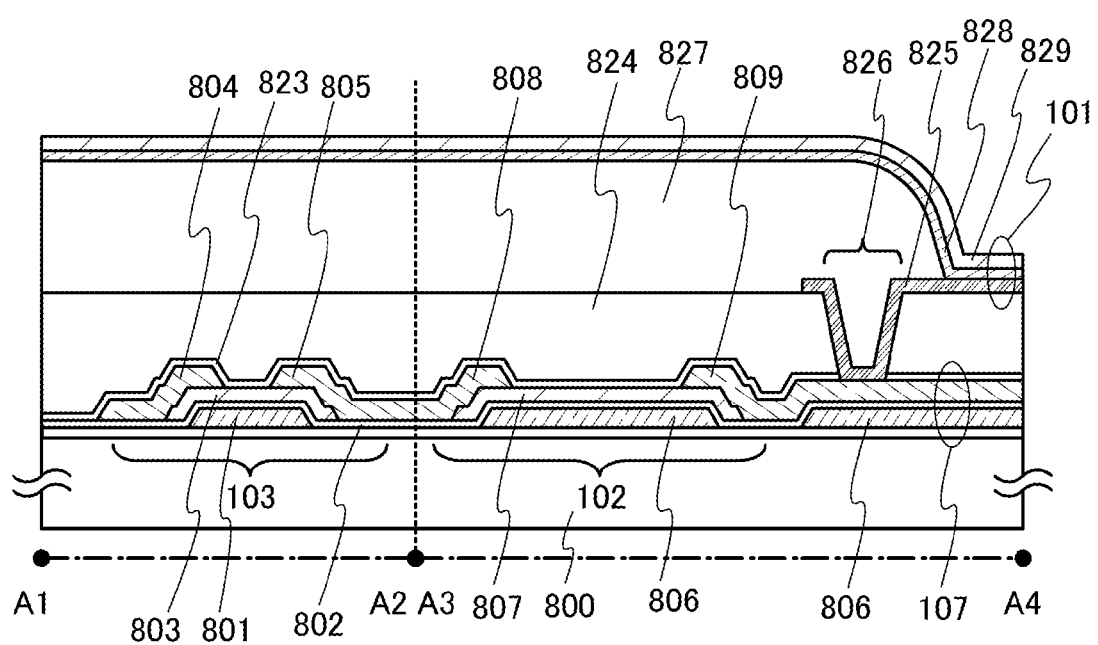
FIG. 6 is a cross-sectional view of a pixel.

FIG. 6 is a cross-sectional view taken along dashed lines A1-A2 and A3-A4 in the top view in FIG. 5.

The transistor 103 includes, over a substrate 800 having an insulating surface, a conductive film 801 functioning as a gate, a gate insulating film 802 over the conductive film 801, a semiconductor layer 803 positioned over the gate insulating film 802 to overlap with the conductive film 801, and conductive films 804 and 805 positioned over the semiconductor layer 803 and functioning as a source and a drain. The conductive film 801 also functions as the scan line G1. The conductive film 804 also functions as the signal line S1.

The transistor 102 includes, over the substrate 800 having an insulating surface, a conductive film 806 functioning as a gate, the gate insulating film 802 over the conductive film 806, a semiconductor layer 807 positioned over the gate insulating film 802 to overlap with the conductive film 806, and conductive films 808 and 809 positioned over the semiconductor layer 807 and functioning as a source and a drain. The conductive film 806 is connected to the conductive film 805 through a contact hole.

The transistor 104 includes, over the substrate 800 having an insulating surface, a conductive film 810 functioning as a gate, the gate insulating film 802 over the conductive film 810, a semiconductor layer 811 positioned over the gate insulating film 802 to overlap with the conductive film 810, and the conductive films 805 and 808 positioned over the semiconductor layer 811 and functioning as a source and a drain. The conductive film 810 also functions as the scan line G2.

The transistor 105 includes, over the substrate 800 having an insulating surface, a conductive film 812 functioning as a gate, the gate insulating film 802 over the conductive film 812, a semiconductor layer 813 positioned over the gate insulating film 802 to overlap with the conductive film 812, and the conductive film 808 and a conductive film 814 which are positioned over the semiconductor layer 813 and which function as a source and a drain. The conductive film 812 also functions as the scan line G3. The conductive film 814 also functions as the power supply line VA.

The transistor 106 includes, over the substrate 800 having an insulating surface, a conductive film 815 functioning as a gate, the gate insulating film 802 over the conductive film 815, a semiconductor layer 816 positioned over the gate insulating film 802 to overlap with the conductive film 815, and the conductive film 809 and a conductive film 817 which are positioned over the semiconductor layer 816 and which function as a source and a drain. The conductive film 815 also functions as the scan line G4.

The capacitor 107 includes, over the substrate 800 having an insulating surface, the conductive film 806, the gate insulating film 802 over the conductive film 806, and the conductive film 809 positioned over the gate insulating film 802 to overlap with the conductive film 806.

The capacitor 108 includes, over the substrate 800 having an insulating surface, a conductive film 818, the gate insulating film 802 over the conductive film 818, and the conductive film 809 positioned over the gate insulating film 802 to overlap with the conductive film 818. The conductive film 818 also functions as the power supply line VB and is connected to the conductive film 817 through a contact hole.

The transistor 109 includes, over the substrate 800 having an insulating surface, a conductive film 819 functioning as a gate, the gate insulating film 802 over the conductive film 819, a semiconductor layer 820 positioned over the gate insulating film 802 to overlap with the conductive film 819, and the conductive film 808 and a conductive film 821 which are positioned over the semiconductor layer 820 and which function as a source and a drain. The conductive film 819 also functions as the scan line G2. The conductive film 821 is connected to a conductive film 822 functioning as the power supply line VC through a contact hole.

An insulating film 823 and an insulating film 824 are formed in this order over the conductive films 804, 805, 808, 809, 814, 817, and 821. Further, a conductive film 825 functioning as an anode is formed over the insulating film 824. The conductive film 825 is connected to the conductive film 809 through a contact hole 826 which is formed in the insulating films 823 and 824.

In addition, an insulating film 827 having an opening where part of the conductive film 825 is exposed is provided over the insulating film 824. An electroluminescent layer 828 and a conductive film 829 functioning as a cathode are stacked in this order over the part of the conductive film 825 and the insulating film 827. A region where the conductive film 825, the electroluminescent layer 828, and the conductive film 829 overlap with one another corresponds to the light-emitting element 101.

Note that FIG. 5 illustrates an example in which each of the conductive films 810 and 819 also function as the scan line G2; however, the conductive films 810 and 819 may be one conductive film.

Figure 7:
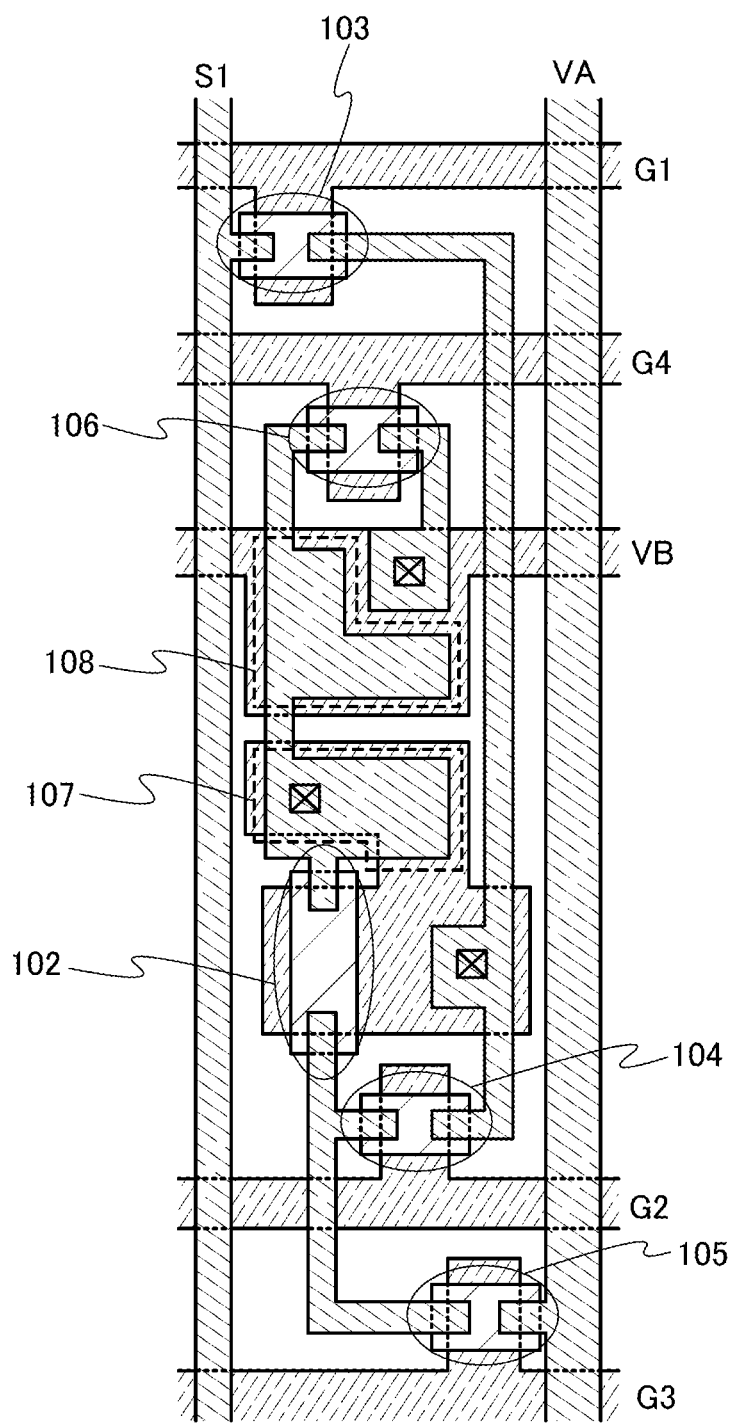
FIG. 7 is a top view of a pixel.

FIG. 7 illustrates an example of a top view of the pixel illustrated in FIG. 4. Note that in the top view of the pixel in FIG. 7, various insulating films are omitted in order to clearly show the layout of the pixel. Further, in the top view of the pixel in FIG. 7, the anode, the electroluminescent layer, and the cathode are omitted in order to clearly show the layout of the transistors and the capacitors included in the pixel.

The pixel illustrated in FIG. 7 is different from that in FIG. 5 in that the transistor 109, the conductive film 819 functioning as the gate of the transistor 109, the conductive film 822 functioning as the power supply line VC, and the conductive film 821 connected to the conductive film 822 are not provided.

Note that FIG. 5, FIG. 6, and FIG. 7 each illustrate, as an example, the case where a wide gap semiconductor such as an oxide semiconductor is used for the semiconductor layers 803, 807, 811, 813, 816, and 820.

An oxide semiconductor has a wider band gap and lower intrinsic carrier density than silicon. Thus, as described above, a transistor including an oxide semiconductor has much lower off-state current than a transistor including a normal semiconductor such as silicon or germanium.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide; a tin oxide; a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$, (m>0, m is not an integer) may be used as the oxide semiconductor. Note that M represents one or more metal elements selected from Ga, Fe, Mn, and Co. Alternatively, as the oxide semiconductor, a material expressed by $In_3SnO_5(ZnO)_n$ (n>0, n is an integer) may be used.

As the oxide semiconductor, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, further preferably 0.1 nm or less.

Note that the average surface roughness ($R_a$) is obtained by expanding, into three dimensions, center line average roughness that is defined by JIS B 0601 so as to be applied to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 3]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

Unless otherwise specified, in the case of an n-channel transistor, off-state current in this specification is current which flows between a source and a drain when the potential of the drain is higher than that of the source and that of a gate while the potential of the gate is lower than or equal to zero when a reference potential is the potential of the source. Alternatively, in the case of a p-channel transistor, off-state current in this specification is current which flows between a source and a drain when a potential of the drain is lower than that of the source and that of a gate while the potential of the gate is higher than or equal to zero when a reference potential is the potential of the source.

As an example of a semiconductor material whose band gap is wider than that of silicon and whose intrinsic carrier density is lower than that of silicon, silicon carbide (SiC), gallium nitride (GaN), or the like can be given as well as an oxide semiconductor. Compound semiconductors such as silicon carbide and gallium nitride are required to be single crystal, and it is difficult to meet the fabricating condition to obtain a single crystal material; for example, crystal growth at a temperature extremely higher than a process temperature of the oxide semiconductor is needed or epitaxial growth over a special substrate is needed. In addition, it is difficult to form such compound semiconductors over a silicon wafer or a glass substrate with low heat resistance, which can be obtained easily. On the other hand, the oxide semiconductor has an advantage of high mass productivity because it can be formed by sputtering or a wet process. Further, an oxide semiconductor can be formed at a room temperature, so that the oxide semiconductor can be formed over a glass substrate, or over an integrated circuit including a semiconductor element, and a larger substrate can be used. Accordingly, an oxide semiconductor particularly has an advantage of high mass productivity. Further, in the case where a crystalline oxide semiconductor is to be obtained in order to improve the performance of a transistor (e.g., field-effect mobility), the crystalline oxide semiconductor can be obtained by heat treatment at 200° C. to 800° C.

For each of a variety of conductive films such as the conductive film 801, the conductive films 804 to 806, the conductive films 808 to 810, the conductive film 812, the conductive film 814, the conductive film 815, the conductive films 817 to 819, the conductive film 821, and the conductive film 822, a film of an element selected from aluminum, chromium, copper, tantalum, titanium, molybdenum, and tungsten; an alloy film containing any of these elements; an alloy film containing the above elements in combination; or the like can be used. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used. A Cu—Mg—Al alloy, a Mo—Ti alloy, Ti, and Mo have high adhesiveness with an oxide film. Accordingly, any of these materials having high adhesiveness with an oxide film is preferably used for the conductive films 804, 805, 808, 809, 814, 817, and 821, which are provided over the gate insulating film 802, when the gate insulating film 802 is an oxide film. For example, a stack in which a conductive film of Cu having low resistance is stacked over a conductive film of a Cu—Mg—Al alloy, an Mo—Ti alloy, Ti, or Mo may be used for the conductive films 804, 805, 808, 809, 814, 817, and 821, whereby adhesiveness with the gate insulating film 802 which is an oxide film is increased and resistance can be reduced.

In the case where an oxide semiconductor layer is used for the semiconductor layers 803, 807, 811, 813, 816, and 820, the oxide semiconductor layer is formed in such a manner that the substrate is held in a treatment chamber kept at reduced pressure, a sputtering gas from which hydrogen and moisture are removed is introduced into the treatment chamber while residual moisture therein is removed, and a target is used. The substrate temperature in film formation may be higher than or equal to 100° C. and lower than or equal to 600° C., preferably higher than or equal to 200° C. and lower than or equal to 400° C. By heating the substrate during the film formation, the impurity concentration in the formed oxide semiconductor layer can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$) (more preferably, also a compound containing a carbon atom), and the like are removed, whereby the impurity concentration in the oxide semiconductor layer formed in the treatment chamber can be reduced.

When the leakage rate of the treatment chamber of the sputtering apparatus is set to $1 \times 10^{-10}$ Pa·m³/s or less, entry of impurities such as alkali metal or hydride into the oxide semiconductor layer that is being formed by sputtering can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, entry of alkali metal, hydrogen atoms, hydrogen molecules, water, a hydroxyl group, hydride, or the like into the oxide semiconductor layer can be suppressed. In addition, the use of the target leads to a reduction in the concentration of alkali metal such as lithium, sodium, or potassium in the oxide semiconductor layer.

Note that, in some cases, the oxide semiconductor layer formed by sputtering or the like contains a large amount of moisture or hydrogen (including a hydroxyl group) as impurities. Moisture and hydrogen easily form a donor level and thus serve as impurities in the oxide semiconductor. In order to reduce impurities such as moisture or hydrogen in the oxide semiconductor layer (dehydration or dehydrogenation), the oxide semiconductor layer is preferably subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the oxide semiconductor layer, moisture or hydrogen in the oxide semiconductor layer can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When RTA is used for the heat treatment, dehydration or dehydrogenation can be performed in a short time; thus, treatment can be performed even at a temperature higher than the strain point of a glass substrate.

Note that the heat treatment apparatus is not limited to an electric furnace, and may include a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably higher than or equal to 6N (99.9999%), further preferably higher than or equal to 7N (99.99999%) (that is, the impurity concentration is lower than or equal to 1 ppm, preferably lower than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating film. Further, in the oxide semiconductor layer, Na cuts or enters a bond between metal and oxygen which are included in the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the concentration of hydrogen in the oxide semiconductor layer is extremely low.

Thus, when the concentration of hydrogen in the oxide semiconductor layer is lower than or equal to $1\times10^{18}/cm^3$, preferably lower than or equal to $1\times10^{17}/cm^3$, the concentration of the impurity is preferably lowered. Specifically, the measurement value of a Na concentration by secondary ion mass spectrometry is preferably lower than or equal to $5\times10^{16}/cm^3$, further preferably lower than or equal to $1\times10^{16}/cm^3$, still further preferably lower than or equal to $1\times10^{15}/cm^3$. Similarly, the measurement value of a Li concentration is preferably lower than or equal to $5\times10^{15}/cm^3$, further preferably lower than or equal to $1\times10^{15}/cm^3$. Similarly, the measurement value of a K concentration is preferably lower than or equal to $5\times10^{15}/cm^3$, further preferably lower than or equal to $1\times10^{15}/cm^3$.

Reducing the hydrogen concentration in the oxide semiconductor layer to highly purify the oxide semiconductor layer leads to stabilization of the oxide semiconductor layer. In addition, heat treatment at a temperature lower than or equal to the glass transition temperature makes it possible to form an oxide semiconductor layer with extremely low carrier density and a wide band gap. Thus, the transistor can be formed using a large substrate, so that mass productivity can be increased. In addition, by using the purified oxide semiconductor layer in which the hydrogen concentration is reduced, it is possible to manufacture a transistor with high withstand voltage and an extremely low off-state current. The above heat treatment can be performed at any time as long as it is performed after the oxide semiconductor layer is formed.

In this embodiment, an oxide including a phase with c-axis alignment, which has a triangular or hexagonal atomic arrangement when seen from the direction of an a-b plane, a surface, or an interface, will be described. In the phase, metal atoms are arranged in a layered manner, or metal atoms and oxygen atoms are arranged in a layered manner along the c-axis, and the direction of the a-axis or the b-axis is varied in the a-b plane (the phase rotates around the c-axis). Such a phase is also referred to as a c-axis aligned crystal (CAAC) phase.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoordinate O and O surrounded by a double circle represents tricoordinate O.

Figure 15A:
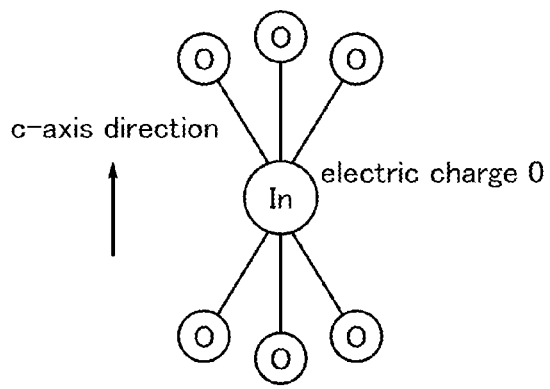
FIGS. 15A to 15E illustrate structures of an oxide material.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
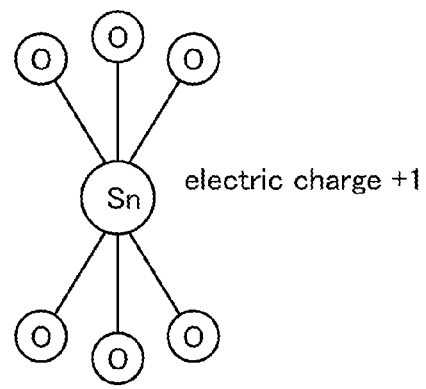
Figure 15B:
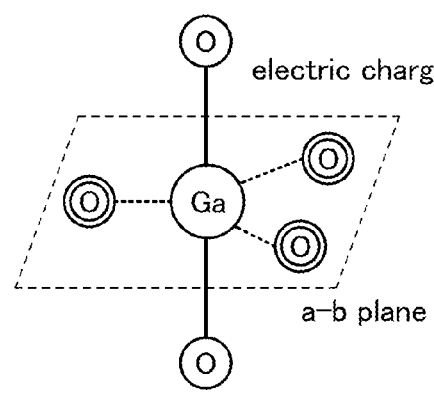

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
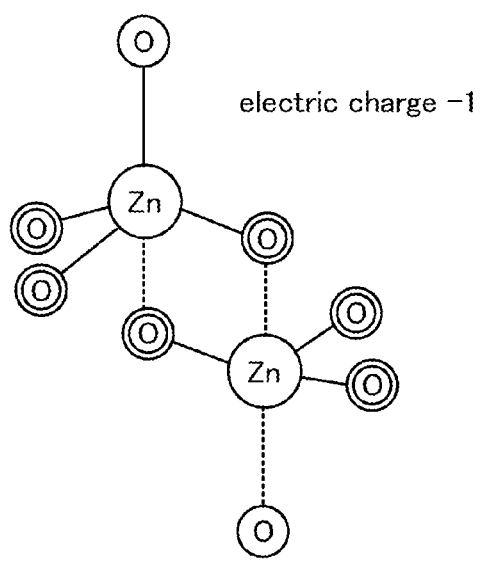
Figure 15C:
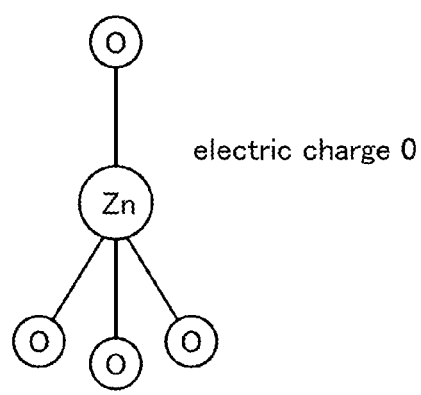

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom in FIG. 15B has one proximate Ga atom in the downward direction, and the one O atom in the lower half has one proximate Ga atom in the upward direction. The one O atom in the upper half with respect to the tetracoordinate Zn atom in FIG. 15C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 16A illustrates a model of a medium group included in a layered structure of an In—Sn—Zn—O-based material. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide such as an In-based oxide, a Sn-based oxide, or a Zn-based oxide; and the like.

Figure 17A:
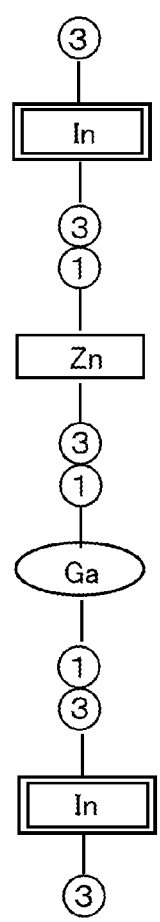
FIGS. 17A to 17C illustrate a structure of an oxide material.

As an example, FIG. 17A illustrates a model of a medium group included in a layered structure of an In—Ga—Zn—O-based material.

In the medium group included in the layered structure of the In—Ga—Zn—O-based material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 17B:
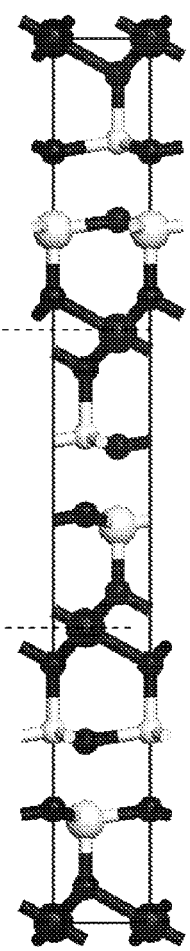
Figure 17C:
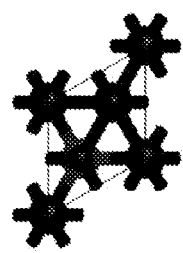

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 17A but also a medium group in which the arrangement of the In atom, the Ga atom, and the Zn atom is different from that in FIG. 17A.

An oxide semiconductor layer including CAAC can be formed by sputtering. In order to obtain CAAC by sputtering, it is important to form hexagonal crystals in an initial stage of deposition of an oxide semiconductor layer and to cause crystal growth from the hexagonal crystals as seed crystals. In order to achieve this, it is preferable that the distance between the target and the substrate be made longer (e.g., approximately 150 mm to 200 mm) and a substrate heating temperature be 100° C. to 500° C., preferably 200° C. to 400° C., further preferably 250° C. to 300° C. In addition, the deposited oxide semiconductor layer is preferably subjected to heat treatment at a temperature higher than the substrate heating temperature during the deposition, so that micro-defects in the film and defects at the interface with a stacked layer can be repaired.

For formation of an In—Sn—Zn-based oxide layer, an oxide target which has a composition ratio of In:Sn:Zn=1:2:2, 2:1:3, 1:1:1, 20:45:35, or the like in atomic ratio is used.

In CAAC, metal atoms and oxygen atoms are bonded in an orderly manner in comparison with an amorphous oxide semiconductor. That is to say, in the case where an oxide semiconductor is amorphous, the coordination numbers of oxygen atoms around a metal atom might vary between various metal atoms, but the coordination numbers of oxygen atoms around a metal atom are almost the same in CAAC. Therefore, microscopic defects of oxygen can be reduced and instability and movement of electric charge that are due to attachment and detachment of hydrogen atoms (including hydrogen ions) or alkali metal atoms can be reduced.

Accordingly, a transistor is formed using an oxide semiconductor layer including CAAC, whereby the amount of shift of the threshold voltage of the transistor, which occurs after light irradiation or a bias-temperature (BT) stress test is performed on the transistor, can be reduced. Thus, a transistor having stable electric characteristics can be formed.

In the case of using an oxide semiconductor layer for the semiconductor layers 803, 807, 811, 813, 816, and 820, insulating films in contact with the oxide semiconductor layer, such as the gate insulating film 802 and the insulating film 823, can be formed using a single layer or a stacked layer using silicon oxide, silicon nitride oxide, silicon oxynitride, hafnium oxide, aluminum oxide, tantalum oxide, yttrium oxide, hafnium silicate (HfSi$_x$O$_y$, (x>0, y>0)), hafnium silicate (HfSi$_x$O$_y$ (x>0, y>0)) to which nitrogen is added, hafnium aluminate (HfAl$_x$O$_y$, (x>0, y>0)) to which nitrogen is added, or the like by a plasma CVD method, a sputtering method, or the like.

An inorganic material containing oxygen is used for the above insulating films, whereby a structure can be provided in which oxygen is supplied from the above insulating films to the oxide semiconductor layer and oxygen defects serving as donors are reduced to satisfy the stoichiometric composition even when the oxygen defects are generated in the oxide semiconductor layer by heat treatment performed to reduce moisture or hydrogen. Thus, the channel formation region can be made to be close to i-type and a variation in electric characteristics of the transistors 103, 104, 105, 106, and 109 due to oxygen defects can be reduced, which results in improvement of the electric characteristics.

The insulating films in contact with the oxide semiconductor layer, such as the gate insulating film 802 and the insulating film 823, may be formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the oxide semiconductor layer, an interface with the oxide semiconductor layer can keep a favorable state.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material containing an aluminum oxide in terms of preventing entry of water to the oxide semiconductor layer.

Note that in FIG. 5, FIG. 6, and FIG. 7, a semiconductor such as silicon or germanium which is amorphous, microcrystalline, or polycrystalline may be used for the semiconductor layers 803, 807, 811, 813, 816, and 820. In the case of using a semiconductor such as silicon or germanium which is amorphous, microcrystalline, or polycrystalline for the semiconductor layers 803, 807, 811, 813, 816, and 820, an impurity element imparting one conductivity type is added to the semiconductor layer so that an impurity region functioning as a source or a drain is formed. For example, an impurity region having n-type conductivity can be formed by addition of phosphorus or arsenic to the semiconductor layer. Further, for example, an impurity region having p-type conductivity can be formed by addition of boron to the semiconductor layer.

Figure 8:
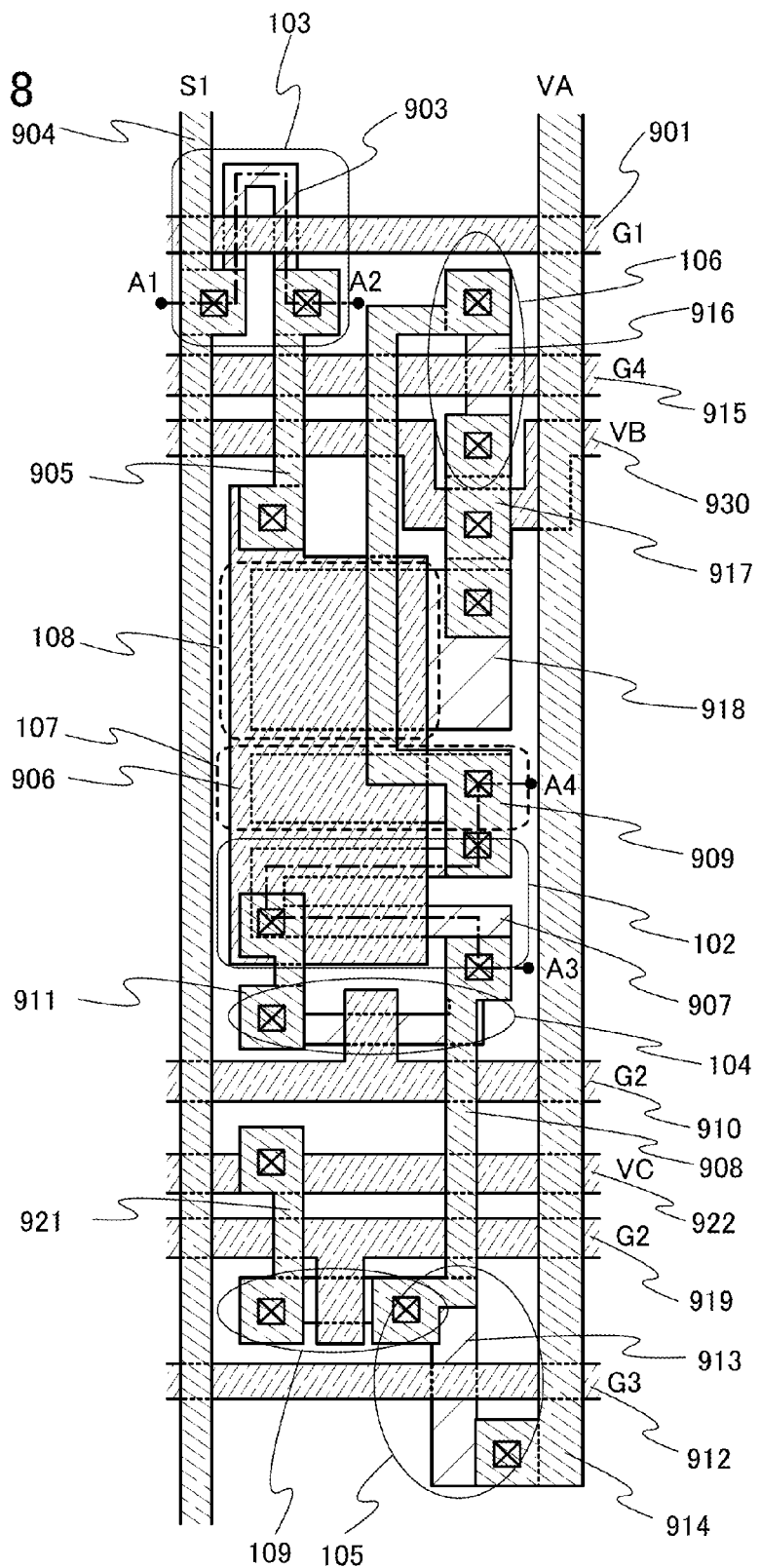
FIG. 8 is a top view of a pixel.

FIG. 8 illustrates another example of a top view of the pixel illustrated in FIG. 1A. Note that in the top view of the pixel in FIG. 8, various insulating films are omitted in order to clearly show the layout of the pixel. Further, in the top view of the pixel in FIG. 8, the anode, the electroluminescent layer, and the cathode are omitted in order to clearly show the layout of the transistors and the capacitors included in the pixel.

Figure 9:
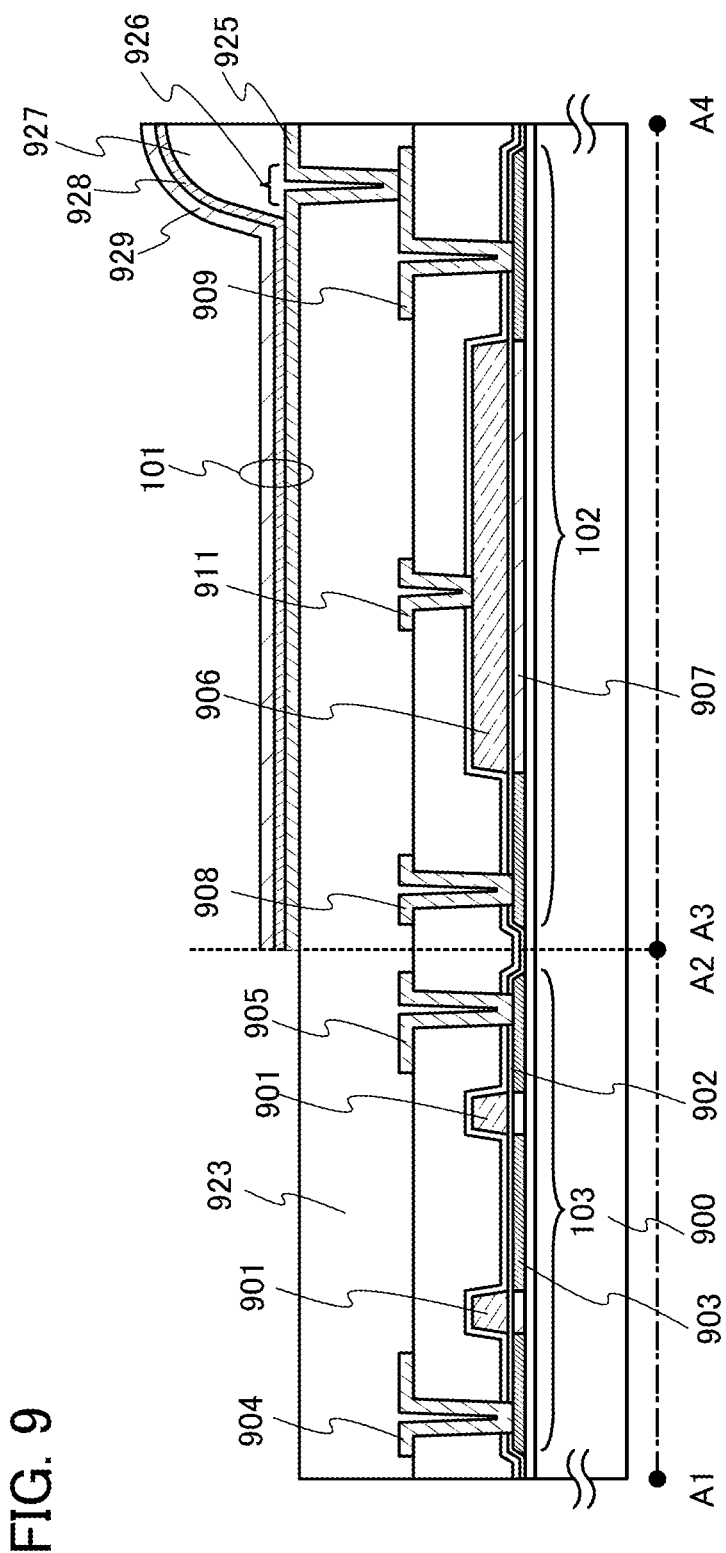
FIG. 9 is a cross-sectional view of a pixel.

FIG. 9 is a cross-sectional view taken along dashed lines A1-A2 and A3-A4 in the top view in FIG. 8.

The transistor 103 includes, over a substrate 900 having an insulating surface, a semiconductor layer 903, a gate insulating film 902 over the semiconductor layer 903, a conductive film 901 positioned over the gate insulating film 902 to overlap with the semiconductor layer 903 and functioning as a gate, and conductive films 904 and 905 positioned over the semiconductor layer 903 and functioning as a source and a drain. The conductive film 901 also functions as the scan line G1. The conductive film 904 also functions as the signal line S1.

The transistor 102 includes, over the substrate 900 having an insulating surface, a semiconductor layer 907, the gate insulating film 902 over the semiconductor layer 907, a conductive film 906 positioned over the gate insulating film 902 to overlap with the semiconductor layer 907 and functioning as a gate, and conductive films 908 and 909 positioned over the semiconductor layer 907 and functioning as a source and a drain. The conductive film 906 is connected to the conductive film 905 through a contact hole.

The transistor 104 includes, over the substrate 900 having an insulating surface, the semiconductor layer 907, the gate insulating film 902 over the semiconductor layer 907, a conductive film 910 positioned over the gate insulating film 902 to overlap with the semiconductor layer 907 and functioning as a gate, and a conductive film 911 and the conductive film 908 which are positioned over the semiconductor layer 907 and which function as a source and a drain. The conductive film 910 also functions as the scan line G2. The conductive film 911 is connected to the conductive film 906 through a contact hole. Note that in FIG. 8, the transistor 102 and the transistor 104 share one semiconductor layer 907; however, the transistor 102 and the transistor 104 may include different semiconductor layers.

The transistor 105 includes, over the substrate 900 having an insulating surface, a semiconductor layer 913, the gate insulating film 902 over the semiconductor layer 913, a conductive film 912 positioned over the gate insulating film 902 to overlap with the semiconductor layer 913 and functioning as a gate, and the conductive film 908 and a conductive film 914 which are positioned over the semiconductor layer 913 and which function as a source and a drain. The conductive film 912 also functions as the scan line G3. The conductive film 914 also functions as the power supply line VA.

The transistor 106 includes, over the substrate 900 having an insulating surface, a semiconductor layer 916, the gate insulating film 902 over the semiconductor layer 916, a conductive film 915 positioned over the gate insulating film 902 to overlap with the semiconductor layer 916 and functioning as a gate, and the conductive film 909 and a conductive film 917 which are positioned over the semiconductor layer 916 and which function as a source and a drain. The conductive film 915 also functions as the scan line G4.

The capacitor 107 includes, over the substrate 900 having an insulating surface, the semiconductor layer 907, the gate insulating film 902 over the semiconductor layer 907, and the conductive film 906 positioned over the gate insulating film 902 to overlap with the semiconductor layer 907. Note that in FIG. 8, the capacitor 107 and the transistor 102 share one semiconductor layer 907; however, the capacitor 107 and the transistor 102 may include different semiconductor layers.

The capacitor 108 includes, over the substrate 900 having an insulating surface, a semiconductor layer 918, the gate insulating film 902 over the semiconductor layer 918, and the conductive film 906 positioned over the gate insulating film 902 to overlap with the semiconductor layer 918. The semiconductor layer 918 is connected to a conductive film 930 also functioning as the power supply line VB through the conductive film 917.

The transistor 109 includes, over the substrate 900 having an insulating surface, the semiconductor layer 913, the gate insulating film 902 over the semiconductor layer 913, a conductive film 919 positioned over the gate insulating film 902 to overlap with the semiconductor layer 913 and functioning as a gate, and the conductive film 908 and a conductive film 921 which are positioned over the semiconductor layer 913 and which function as a source and a drain. The conductive film 919 also functions as the scan line G2. The conductive film 921 is connected to a conductive film 922 also functioning as the power supply line VC through a contact hole. Note that in FIG. 8, the transistor 105 and the transistor 109 share one semiconductor layer 913; however, the transistor 105 and the transistor 109 may include different semiconductor layers.

An insulating film 923 is formed over the conductive films 904, 905, 908, 909, 911, 914, 917, and 921. Further, a conductive film 925 functioning as an anode is formed over the insulating film 923. The conductive film 925 is connected to the conductive film 909 through a contact hole 926 which is formed in the insulating film 923.

In addition, an insulating film 927 having an opening where part of the conductive film 925 is exposed is provided over the insulating film 923. An electroluminescent layer 928 and a conductive film 929 functioning as a cathode are stacked in this order over the part of the conductive film 925 and the insulating film 927. A region where the conductive film 925, the electroluminescent layer 928, and the conductive film 929 overlap with one another corresponds to the light-emitting element 101.

Note that FIG. 8 illustrates an example in which each of the conductive films 910 and 919 also function as the scan line G2; however, the conductive films 910 and 919 may be one conductive film.

Note that a semiconductor such as silicon or germanium which is single crystalline is used for the semiconductor layers 903, 907, 913, 916, and 918.

In the case of using single crystal silicon for the semiconductor layers 903, 907, 913, 916, and 918, first, a bond substrate which is a single crystal semiconductor substrate is prepared. Then, an ion beam including ions which are accelerated by an electric field enters the bond substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate is bonded to the substrate 900 having an insulating surface. After the bond substrate and the substrate 900 are overlapped with each other, a pressure of approximately 1 $N/cm^2$ to 500 $N/cm^2$, preferably 11 $N/cm^2$ to 20 $N/cm^2$ is applied to part of the bond substrate and part of the substrate 900 so that the substrates are attached to each other. When the pressure is applied, bonding between the bond substrate and the insulating surface of the substrate 900 starts from the parts, which results in bonding of the entire surface where the bond substrate and the insulating surface of the substrate 900 are in close contact with each other. Then, heat treatment is performed, whereby microvoids that exist in the embrittlement layer increase in volume and are thus combined with each other. Consequently, a single crystal semiconductor layer which is part of the bond substrate is separated from the bond substrate along the embrittlement layer. The heat treatment is performed at a temperature not exceeding the strain point of the substrate 900. Then, the single crystal semiconductor layer is processed into a desired shape by etching or the like, so that the semiconductor layers 903, 907, 913, 916, and 918 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor layers 903, 907, 913, 916, and 918. An impurity element for controlling the threshold voltage may be added to the semiconductor layer which has not been patterned or may be added to the semiconductor layers 903, 907, 913, 916, and 918 which are formed through the patterning. Alternatively, the impurity element for controlling the threshold voltage may be added to the bond substrate. Further alternatively, the impurity element may be added to the bond substrate in order to roughly control the threshold voltage, and the impurity element may be further added to the semiconductor layer which has not been patterned or the semiconductor layers 903, 907, 913, 916, and 918 which are formed through the patterning in order to finely control the threshold voltage.

Note that a polycrystalline, microcrystalline, or amorphous semiconductor layer which is formed over the substrate 900 having an insulating surface by vapor deposition may be used for the semiconductor layers 903, 907, 913, 916, and 918, for example. Alternatively, the semiconductor layers may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate as the substrate 900, it is possible to use any of the following crystallization methods: a thermal crystallization method using an electrically heated oven, a lamp annealing crystallization method using infrared light, a crystallization method using a catalytic element, a high-temperature annealing method at approximately 950° C., and the like.

Alternatively, a wide gap semiconductor such as an oxide semiconductor may be used for the semiconductor layers 903, 907, 913, 916, and 918. In the case of using an oxide semiconductor for the semiconductor layers 903, 907, 913, 916, and 918, a dopant is added to each semiconductor layer to form an impurity region functioning as a source or a drain. The dopant can be added by ion implantation. As the dopant, for example, a rare gas such as helium, argon, or xenon, a Group 15 element such as nitrogen, phosphorus, arsenic, or antimony, or the like can be used. For example, when nitrogen is used as the dopant, the concentration of nitrogen atoms in the impurity region is preferably higher than or equal to $5 \times 10^{19}/cm^3$ and lower than or equal to $1 \times 10^{22}/cm^3$.

In the light-emitting device according to one embodiment of the present invention, a color filter method can be employed, in which full-color images are displayed by using a combination of a color filter and a light-emitting element which emits light of a single color such as white. Alternatively, it is possible to employ a method in which full-color images are displayed by using a plurality of light-emitting elements which emit light of different hues. This method is called a separate coloring method, because electroluminescent layers each provided between a pair of electrodes in a light-emitting element are separately colored with corresponding colors.

In the separate coloring method, generally, the electroluminescent layers are separately colored by evaporation using a mask such as a metal mask. Thus, the size of a pixel depends on the accuracy of separate coloring of the electroluminescent layers by evaporation. Meanwhile, electroluminescent layers need not be separately colored in the color filter method, unlike in the separate coloring method. Accordingly, pixels can be downsized more easily than in the separate coloring method; thus, a high-definition pixel portion can be realized.

Light-emitting devices include bottom-emission light-emitting devices in which light emitted from a light-emitting element is extracted from a side where an element substrate (e.g., the substrate 800 or the substrate 900) over which a transistor is formed is provided, and top-emission light-emitting devices in which light emitted from a light-emitting element is extracted from a side opposite to an element substrate. In the top-emission structure, light emitted from the light-emitting element is not blocked by an element such as a wiring, a transistor, or a storage capacitor, so that the efficiency of light extraction from a pixel can be made higher than in the bottom-emission structure. Accordingly, the top-emission structure can achieve high luminance even when the amount of current supplied to the light-emitting element is reduced, and therefore is advantageous in improving the lifetime of a light-emitting element.

The light-emitting device according to one embodiment of the present invention may have a microcavity (micro optical resonator) structure in which light emitted from an electroluminescent layer is resonated within a light-emitting element. With the microcavity structure, light having a specific wavelength can be extracted from the light-emitting element with high efficiency, so that the luminance and the color purity of the pixel portion can be improved.

Figure 10:
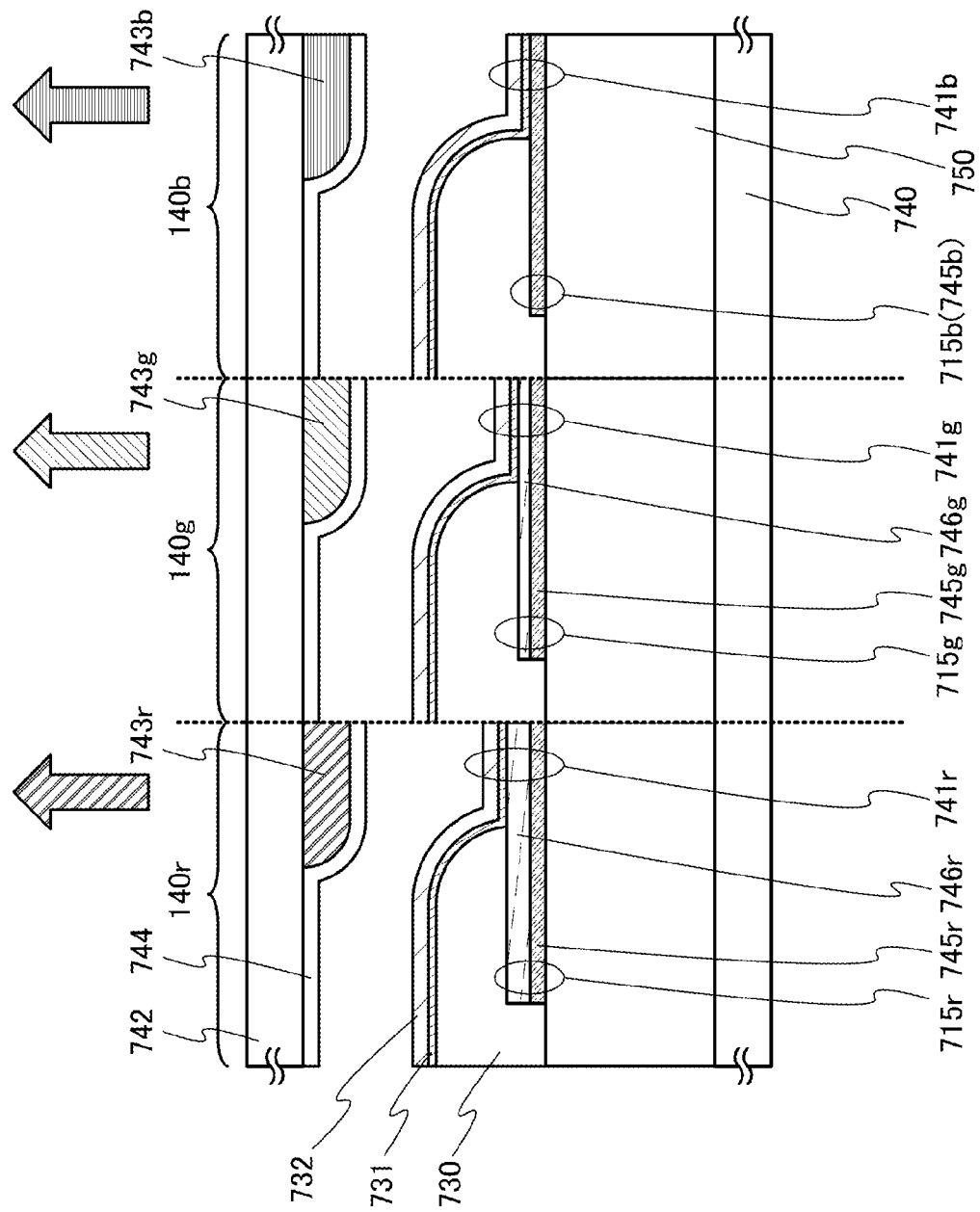
FIG. 10 is a cross-sectional view of a pixel.

FIG. 10 illustrates an example of a cross-sectional view of a pixel having a microcavity structure. FIG. 10 illustrates part of a cross section of a pixel corresponding to red, part of a cross section of a pixel corresponding to green, and part of a cross section of a pixel corresponding to blue.

Specifically, a pixel 140r corresponding to red, a pixel 140g corresponding to green, and a pixel 140b corresponding to blue are illustrated in FIG. 10. The pixel 140r, the pixel 140g, and the pixel 140b include an anode 715r, an anode 715g, and an anode 715b, respectively. The anodes 715r, 715g, and 715b included in the pixels 140r, 140g, and 140b are provided over an insulating film 750 which is formed over a substrate 740.

A partition 730 formed using an insulating film is provided over the anodes 715r, 715g, and 715b. The partition 730 has openings, where respective parts of the anodes 715r, 715g, and 715b are exposed. Further, an electroluminescent layer 731 and a cathode 732 which transmits visible light are stacked in this order over the partition 730 so as to cover the above exposed parts.

A portion where the anode 715r, the electroluminescent layer 731, and the cathode 732 overlap with one another corresponds to a light-emitting element 741r corresponding to red. A portion where the anode 715g, the electroluminescent layer 731, and the cathode 732 overlap with one another corresponds to a light-emitting element 741g corresponding to green. A portion where the anode 715b, the electroluminescent layer 731, and the cathode 732 overlap with one another corresponds to a light-emitting element 741b corresponding to blue.

In addition, a substrate 742 is provided to face the substrate 740 with the light-emitting elements 741r, 741g, and 741b interposed therebetween. A coloring layer 743r corresponding to the pixel 140r, a coloring layer 743g corresponding to the pixel 140g, and a coloring layer 743b corresponding to the pixel 140b are provided on the substrate 742. The coloring layer 743r is a layer whose transmittance of light in a wavelength range corresponding to red is higher than that of light in other wavelength ranges, the coloring layer 743g is a layer whose transmittance of light in a wavelength range corresponding to green is higher than that of light in other wavelength ranges, and the coloring layer 743b is a layer whose transmittance of light in a wavelength range corresponding to blue is higher than that of light in other wavelength ranges.

Further, an overcoat 744 is provided on the substrate 742 so as to cover the coloring layers 743r, 743g, and 743b. The overcoat 744 is a layer which transmits visible light and is provided for protecting the coloring layers 743r, 743g, and 743b, and a resin material with which planarity can be improved is preferably used therefor. The coloring layers 743r, 743g, and 743b and the overcoat 744 may be collectively regarded as a color filter, or each of the coloring layers 743r, 743g, and 743b may be regarded as a color filter.

In FIG. 10, a conductive film 745r having high visible-light reflectance and a conductive film 746r having higher visible-light transmittance than the conductive film 745r are stacked in this order to be used as the anode 715r. Further, a conductive film 745g having high visible-light reflectance and a conductive film 746g having higher visible-light transmittance than the conductive film 745g are stacked in this order to be used as the anode 715g. The conductive film 746g has a smaller thickness than the conductive film 746r. In addition, a conductive film 745b having high visible-light reflectance is provided to be used as the anode 715b.

Thus, in the light-emitting device in FIG. 10, the optical path length of light emitted from the electroluminescent layer 731 in the light-emitting element 741r can be adjusted by the distance between the conductive film 745r and the cathode 732. The optical path length of light emitted from the electroluminescent layer 731 in the light-emitting element 741g can be adjusted by the distance between the conductive film 745g and the cathode 732. The optical path length of light emitted from the electroluminescent layer 731 in the light-emitting element 741b can be adjusted by the distance between the conductive film 745b and the cathode 732.

In one embodiment of the present invention, a microcavity structure may be employed, in which the above optical path lengths are adjusted in accordance with the wavelengths of light emitted from the light-emitting elements 741r, 741g, and 741b, so that light emitted from the electroluminescent layer 731 is resonated within each light-emitting element. For example, in FIG. 10, when the distance between the cathode 732 and any of the conductive films 745r, 745g, and 745b is denoted by L, the refractive index of the electroluminescent layer 731 is denoted by n, and the wavelength of light to be resonated is denoted by $\lambda$, adjustment is preferably made such that the product of the distance L and the refractive index n equals $(2N-1)/4$ (N is a natural number) times the wavelength $\lambda$.

When the above microcavity structure is applied to the light-emitting device according to one embodiment of the present invention, light having a wavelength corresponding to red, of light emitted from the light-emitting element 741r, is increased in intensity by being resonated. Consequently, the color purity and the luminance of red light obtained through the coloring layer 743r are increased. Light having a wavelength corresponding to green, of light emitted from the light-emitting element 741g, is increased in intensity by being resonated. Consequently, the color purity and the luminance of green light obtained through the coloring layer 743g are increased. Light having a wavelength corresponding to blue, of light emitted from the light-emitting element 741b, is increased in intensity by being resonated. Consequently, the color purity and the luminance of blue light obtained through the coloring layer 743b are increased.

Note that although pixels corresponding to three colors of red, green, and blue are used in FIG. 10, one embodiment of the present invention is not limited to this structure. In one embodiment of the present invention, a combination of four colors of red, green, blue, and yellow or a combination of three colors of cyan, magenta, and yellow may be used. Alternatively, a combination of six colors of pale red, pale green, pale blue, deep red, deep green, and deep blue or a combination of six colors of red, green, blue, cyan, magenta, and yellow may be used.

Note that, for example, colors that can be expressed using the pixels of red (R), green (G), and blue (B) are limited to colors existing in the triangle made by the three points on the chromaticity diagram which correspond to the emission colors of the respective pixels. Therefore, as in the case where the pixels of red (R), green (G), blue (B), and yellow (Y) are used, by additionally providing a light-emitting element of a color existing outside the triangle on the chromaticity diagram, the range of the colors which can be expressed in the light-emitting device can be expanded, so that color reproducibility can be enhanced.

In FIG. 10, the conductive film 745b having high visible-light reflectance is used as the anode in the light-emitting element 741b which emits light with the shortest wavelength $\lambda$ among the light-emitting elements 741r, 741g, and 741b, and the conductive films 746r and 746g having different thicknesses are respectively used in the other light-emitting elements 741r and 741g; thus, the optical path lengths are adjusted. In one embodiment of the present invention, a conductive film having high visible-light transmittance, such as the conductive films 746r and 746g, may be provided over the conductive film 745b having high visible-light reflectance also in the light-emitting element 741b which emits light with the shortest wavelength $\lambda$. However, it is preferable to use the conductive film 745b having high visible-light reflectance as the anode of the light-emitting element 741b which emits light with the shortest wavelength $\lambda$, as shown in FIG. 10, because a manufacturing process of the anode can be simplified as compared to the case of using a conductive film having high visible-light transmittance for the anodes of all the light-emitting elements.

Note that in many cases, the work function of the conductive film 745b having high visible-light reflectance is smaller than those of the conductive films 746r and 746g having high visible-light transmittance. Accordingly, in the light-emitting element 741b which emits light with the shortest wavelength $\lambda$, holes are less likely to be injected from the anode 715b into the electroluminescent layer 731 than in the light-emitting elements 741r and 741g, resulting in low emission efficiency. In view of this, in one embodiment of the present invention, a composite material in which a substance having an acceptor property (electron-accepting property) with respect to a substance having a high hole-transport property is contained in the substance having a high hole-transport property is preferably used for a layer which is included in the electroluminescent layer 731 and provided in contact with the conductive film 745b having high visible-light reflectance in the light-emitting element 741b which emits light with the shortest wavelength $\lambda$. When the above composite material is provided in contact with the anode 715b, holes can be easily injected from the anode 715b into the electroluminescent layer 731, so that the emission efficiency of the light-emitting element 741b can be increased.

As the substance having an acceptor property, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their high acceptor property. Among these, molybdenum oxide is particularly preferable because it is stable in the air, has a low hygroscopic property, and is easily handled.

As the substance having a high hole-transport property used for the composite material, any of a variety of compounds such as an aromatic amine compound, a carbazole derivative, aromatic hydrocarbon, and a macromolecular compound (e.g., an oligomer, a dendrimer, or a polymer) can be used. The organic compound used for the composite material is preferably an organic compound having a high hole-transport property. Specifically, a substance having a hole mobility of $10^{-6}$ cm$^2$/Vs or higher is preferably used. Note that other than these substances, any substance that has a property of transporting more holes than electrons may be used.

The conductive films 745r, 745g, and 745b having high visible-light reflectance can be formed using a single layer or a stacked layer using aluminum, silver, an alloy containing such a metal material, or the like, for example. Alternatively, the conductive films 745r, 745g, and 745b may be formed by stacking a conductive film having high visible-light reflectance and a thin conductive film (preferably with a thickness of 20 nm or less, further preferably 10 nm or less). For example, a thin titanium film or a thin molybdenum film may be stacked over a conductive film having high visible-light reflectance to form the conductive film 745b, in which case an oxide film can be prevented from being formed on a surface of the conductive film having high visible-light reflectance (e.g., aluminum, an alloy containing aluminum, or silver).

For the conductive films 746r and 746g having high visible-light transmittance, for example, indium oxide, tin oxide, zinc oxide, indium tin oxide, indium zinc oxide, or the like can be used.

The cathode 732 can be formed by stacking a conductive film thin enough to transmit light (preferably with a thickness of 20 nm or less, further preferably 10 nm or less) and a conductive film including a conductive metal oxide, for example. The conductive film thin enough to transmit light can be formed using a single layer or a stacked layer using silver, magnesium, an alloy containing such a metal material, or the like. As the conductive metal oxide, it is possible to use indium oxide, tin oxide, zinc oxide, indium oxide-tin oxide, indium oxide-zinc oxide, or any of these metal oxide materials containing silicon oxide.

This embodiment can be implemented in appropriate combination with any of the other embodiments.

Embodiment 3

Figure 11:
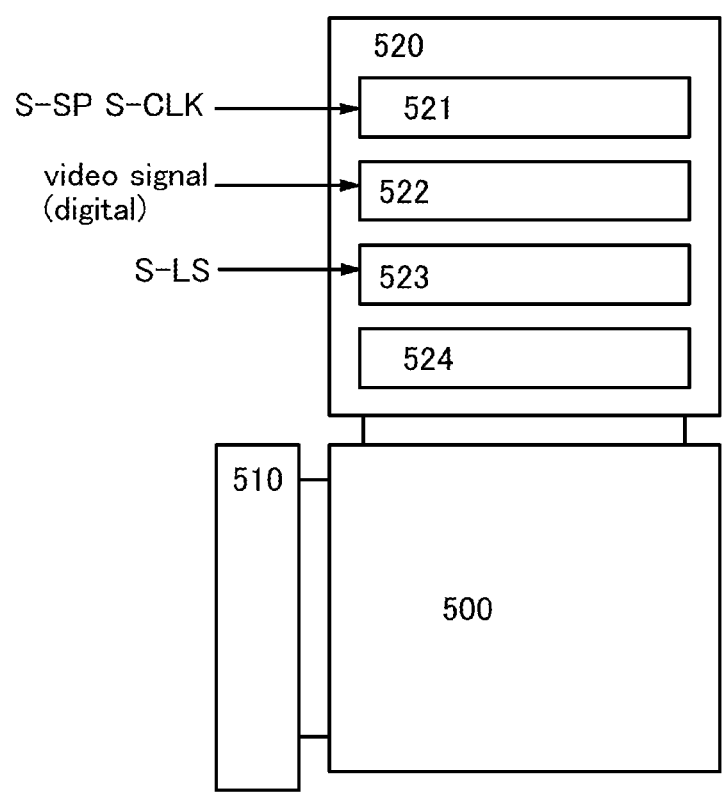
FIG. 11 is a block diagram of a driver circuit.

In this embodiment, an example of a specific structure of a light-emitting device according to one embodiment of the present invention will be described. In FIG. 11, a block diagram of a light-emitting device in this embodiment is shown as an example. Note that in the block diagram in FIG. 11, circuits in the light-emitting device are classified according to their functions and are illustrated as separated blocks. However, it is difficult to classify actual circuits according to their functions completely and one circuit may have a plurality of functions.

The light-emitting device shown in FIG. 11 includes a pixel portion 500 including a plurality of pixels, a scan line driver circuit 510 which selects pixels per line, and a signal line driver circuit 520 which controls an input of an image signal to the pixels in the selected line.

The structure of the pixel portion 500 can be, for example, the structure of the pixel portion in the light-emitting device described in Embodiment 1.

The signal line driver circuit 520 includes a shift register 521, a first memory circuit 522, a second memory circuit 523, and a DA converter circuit 524. A clock signal S-CLK and a start pulse signal S-SP are input to the shift register 521. The shift register 521 generates timing signals, pulses of which are sequentially shifted, in response to the clock signal S-CLK and the start pulse signal S-SP, and outputs the timing signals to the first memory circuit 522. The order of the appearance of the pulses of the timing signals may be switched in response to scan direction switching signals.

When a timing signal is input to the first memory circuit 522, image signals are sequentially applied to and held in the first memory circuit 522 in response to the pulse of the timing signal. The image signals may be sequentially supplied to a plurality of memory circuits included in the first memory circuit 522. Alternatively, so-called division driving may be performed, in which a plurality of memory circuits included in the first memory circuit 522 are divided into several groups and image signals are input to each group in parallel.

The time until the completion of application of image signals to all of the memory circuits in the first memory circuit 522 is referred to as a line period. In practice, the line period may include a horizontal retrace period.

When one line period is finished, the image signals held in the first memory circuit 522 are applied to the second memory circuit 523 all at once and held in response to the pulse of a latch signal S-LS which is input to the second memory circuit 523. Image signals in the next line period are sequentially applied to the first memory circuit 522 which has finished sending the image signals to the second memory circuit 523, in response to timing signals from the shift register 521. During this second round of one line period, the image signals that are applied to and held in the second memory circuit 523 are input to the DA converter circuit 524.

The DA converter circuit 524 converts an input digital image signal into an analog image signal and inputs the analog image signal to each pixel included in the pixel portion 500 through the signal line.

Note that in the signal line driver circuit 520, a circuit that can output signals, pulses of which are sequentially shifted, may be used instead of the shift register 521.

Although the pixel portion 500 is directly connected to the subsequent stage to the DA converter circuit 524 in FIG. 11, one embodiment of the present invention is not limited to this structure. A circuit performing signal processing on the image signal output from the DA converter circuit 524 can be provided at the previous stage to the pixel portion 500. Examples of circuits performing signal processing include a buffer and a level shifter.

Next, operation of the scan line driver circuit 510 will be described. The scan line driver circuit 510 generates a selection signal the pulse of which sequentially shifts and inputs the selection signal to a plurality of scan lines to select pixels per line. When pixels are selected by a selection signal, a plurality of transistors whose gates are electrically connected to one of the scan lines are turned on or off as appropriate, so that signals or power supply potentials are supplied.

Note that although the pixel portion 500, the scan line driver circuit 510, and the signal line driver circuit 520 may be provided over the same substrate, any of these may be provided over a different substrate.

This embodiment can be implemented in appropriate combination with any of the above embodiments.

Embodiment 4

Figure 12:
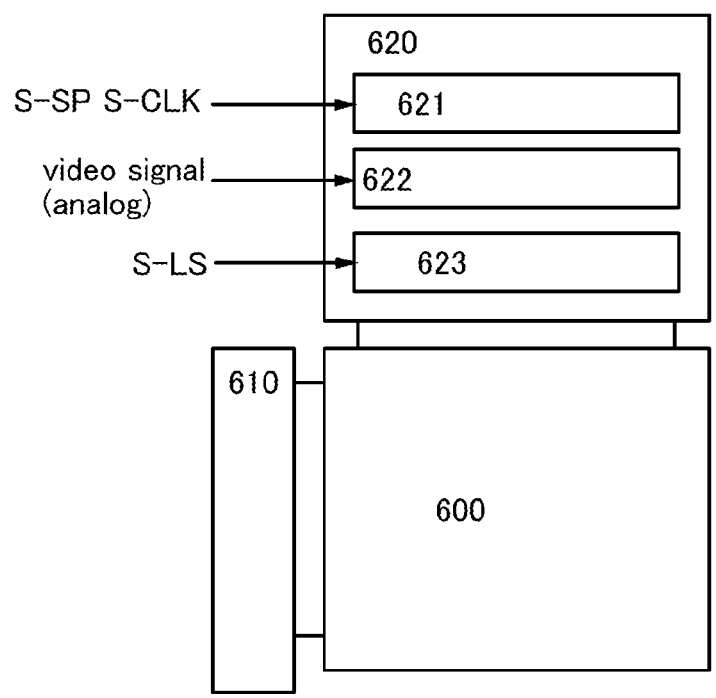
FIG. 12 is a block diagram of a driver circuit.

In this embodiment, an example of a specific structure of a light-emitting device according to one embodiment of the present invention will be described. In FIG. 12, a block diagram of a light-emitting device in this embodiment is shown as an example. Note that in the block diagram in FIG. 12, circuits in the light-emitting device are classified according to their functions and are illustrated as separated blocks. However, it is difficult to classify actual circuits according to their functions completely and one circuit may have a plurality of functions.

The light-emitting device according to one embodiment of the present invention shown in FIG. 12 includes a pixel portion 600 including a plurality of pixels, a scan line driver circuit 610 which selects pixels per line, and a signal line driver circuit 620 which controls an input of an image signal to the pixels in the selected line.

The structure of the pixel portion 600 can be, for example, the structure of the pixel portion in the light-emitting device described in Embodiment 1.

The signal line driver circuit 620 includes at least a shift register 621, a sampling circuit 622, and a memory circuit 623 which can store analog signals. A clock signal S-CLK and a start pulse signal S—SP are input to the shift register 621. The shift register 621 generates timing signals, pulses of which are sequentially shifted, in response to the clock signal S-CLK and the start pulse signal S—SP and inputs the timing signals to the sampling circuit 622. The sampling circuit 622 samples analog image signals for one line period, which are input to the signal line driver circuit 620, in response to the input timing signals. When all the image signals for one line period are sampled, the sampled image signals are output to the memory circuit 623 all at once and held in response to the latch signal S-LS. The image signals held in the memory circuit 623 are input to the pixel portion 600 through the signal lines.

Note that in this embodiment, an example is described in which all the image signals for one line period are sampled in the sampling circuit 622 and then, the sampled image signals are input all at once to the memory circuit 623 at the subsequent stage; however, one embodiment of the present invention is not limited thereto. In the sampling circuit 622, every time an image signal corresponding to each pixel is sampled, the sampled image signal may be input to the memory circuit 623 at the subsequent stage without waiting for one line period to finish.

In addition, image signals may be sampled per pixel sequentially, or pixels in one line may be divided into a plurality of groups and image signals may be sampled per group of pixels in parallel.

Note that although the pixel portion 600 is directly connected to the subsequent stage to the memory circuit 623 in FIG. 12, one embodiment of the present invention is not limited thereto. A circuit performing signal processing on the analog image signal output from the memory circuit 623 can be provided at the previous stage to the pixel portion 600. Examples of circuits performing signal processing include a buffer which can shape a waveform.

Then, in parallel to an input of the image signals from the memory circuit 623 to the pixel portion 600, the sampling circuit 622 can sample image signals for the next line period.

Next, operation of the scan line driver circuit 610 will be described. The scan line driver circuit 610 generates a selection signal the pulse of which sequentially shifts and inputs the selection signal to a plurality of scan lines to select pixels per line. When pixels are selected by a selection signal, a plurality of transistors whose gates are electrically connected to one of the scan lines are turned on or off as appropriate, so that signals or power supply potentials are supplied.

Note that although the pixel portion 600, the scan line driver circuit 610, and the signal line driver circuit 620 may be provided over the same substrate, any of these may be provided over a different substrate.

This embodiment can be implemented in appropriate combination with any of the above embodiments.

Embodiment 5

Figure 13:
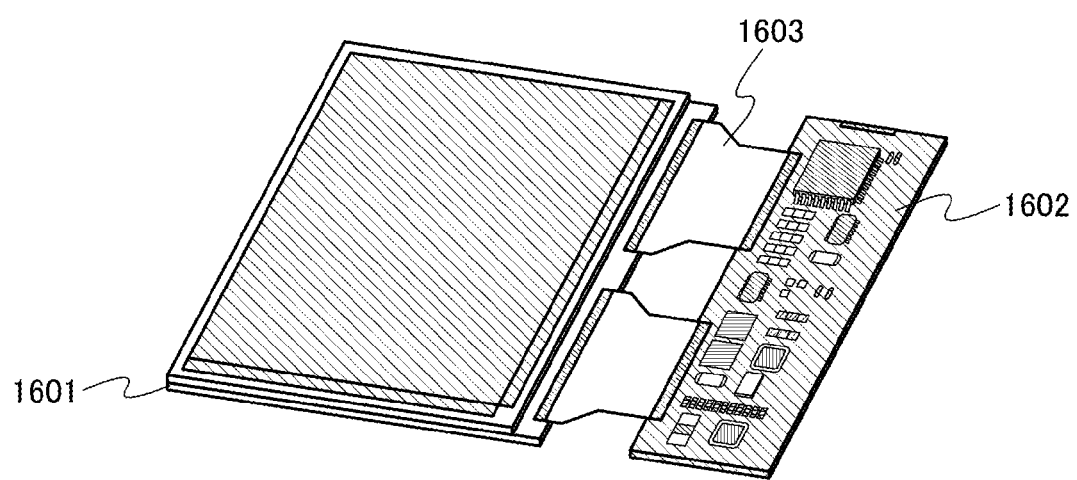
FIG. 13 is a perspective view of a light-emitting device.

FIG. 13 is an example of a perspective view of the light-emitting device according to one embodiment of the present invention. FIG. 13 illustrates an example of a light-emitting device in which the light-emitting device in any of the above embodiments is used for a display portion.

The light-emitting device illustrated in FIG. 13 includes a display portion 1601, a circuit board 1602, and connection portions 1603.

The circuit board 1602 is provided with an image processing portion, from which various signals and power supply potentials are input to the display portion 1601 through the connection portions 1603. For the connection portions 1603, a flexible printed circuit (FPC) or the like can be used. Alternatively, a COF tape can be used for the connection portions 1603, in which case part of circuits of the image processing portion or part of the driver circuits included in the display portion 1601 may be formed over a separately prepared chip, and the chip may be connected to the COF tape by a chip on film (COF) method.

This embodiment can be implemented in combination with any of the above embodiments.

Embodiment 6

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically. In this embodiment, the field-effect mobility of an ideal oxide semiconductor without a defect inside the semiconductor is calculated theoretically, and calculation results of characteristics of minute transistors that are manufactured using such an oxide semiconductor are shown.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 4]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 5]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L} \exp\left(-\frac{E}{kT}\right) \quad \text{[FORMULA 6]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) =$$
$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad \text{[FORMULA 7]}$$

The right side of Formula 7 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, $\mu_0$ can be calculated to be 120 cm$^2$/Vs from Formula 4 and Formula 5. The measured mobility of an In—Sn—Zn-based oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as the following formula.

$$\frac{1}{\mu_1} = \frac{1}{\mu_0} + \frac{D}{B}\exp\left(-\frac{x}{G}\right) \quad \text{[FORMULA 8]}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). As D increases (i.e., when the gate voltage is increased), the second term of Formula 8 is increased and accordingly the mobility $\mu_1$ is decreased.

Figure 18:
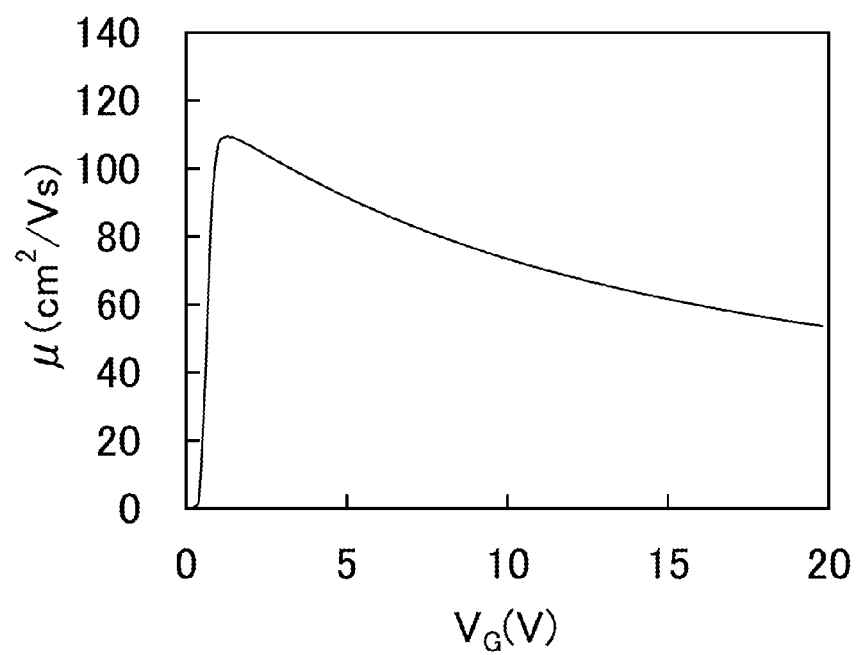
FIG. 18 shows gate voltage dependence of mobility obtained by calculation.

Calculation results of the mobility $\mu_2$ of a transistor whose channel includes an ideal oxide semiconductor without a defect inside the semiconductor are shown in FIG. 18. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 8103a and a semiconductor region 8103c which have n$^+$-type conductivity in an oxide semiconductor layer. The resistivities of the semiconductor region 8103a and the semiconductor region 8103c are $2\times10^{-3}$ Ωcm.

The transistor illustrated in FIG. 22A is formed over a base insulator 8101 and an embedded insulator 8102 which is embedded in the base insulator 8101 and formed of aluminum oxide. The transistor includes the semiconductor region 8103a, the semiconductor region 8103c, an intrinsic semiconductor region 8103b serving as a channel formation region therebetween, and a gate 8105. The width of the gate 8105 is 33 nm.

A gate insulator 8104 is formed between the gate 8105 and the semiconductor region 8103b. In addition, a sidewall insulator 8106a and a sidewall insulator 8106b are formed on both side surfaces of the gate 8105, and an insulator 8107 is formed over the gate 8105 so as to prevent a short circuit between the gate 8105 and another wiring. The sidewall insulator has a width of 5 nm. A source 8108a and a drain 8108b are provided in contact with the semiconductor region 8103a and the semiconductor region 8103c, respectively. Note that the channel width of this transistor is 40 nm.

The transistor of FIG. 22B is the same as the transistor of FIG. 22A in that it is formed over the base insulator 8101 and the embedded insulator 8102 formed of aluminum oxide and that it includes the semiconductor region 8103a, the semiconductor region 8103c, the intrinsic semiconductor region 8103b provided therebetween, the gate 8105 having a width of 33 nm, the gate insulator 8104, the sidewall insulator 8106a, the sidewall insulator 8106b, the insulator 8107, the source 8108a, and the drain 8108b.

The transistor illustrated in FIG. 22A is different from the transistor illustrated in FIG. 22B in the conductivity type of semiconductor regions under the sidewall insulator 8106a and the sidewall insulator 8106b. In the transistor illustrated in FIG. 22A, the semiconductor regions under the sidewall insulator 8106a and the sidewall insulator 8106b are part of the semiconductor region 8103a having n+-type conductivity and part of the semiconductor region 8103c having n+-type conductivity, whereas in the transistor illustrated in FIG. 22B, the semiconductor regions under the sidewall insulator 8106a and the sidewall insulator 8106b are part of the intrinsic semiconductor region 8103b. In other words, a region having a width of $L_{off}$ which overlaps with neither the semiconductor region 8103a (the semiconductor region 8103c) nor the gate 8105 is provided. This region is called an offset region, and the width $L_{off}$ is called an offset length. As is seen from the drawing, the offset length is equal to the width of the sidewall insulator 8106a (the sidewall insulator 8106b).

Figure 19A:
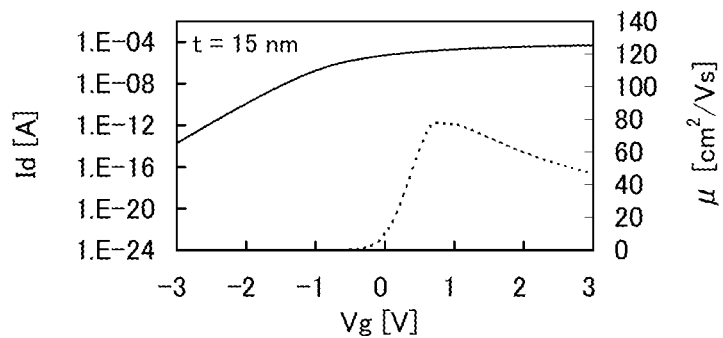
FIGS. 19A to 19C each show gate voltage dependence of drain current and mobility obtained by calculation.
Figure 19B:
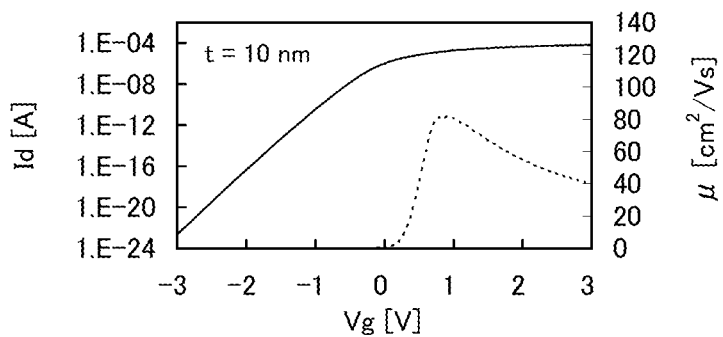
Figure 19C:
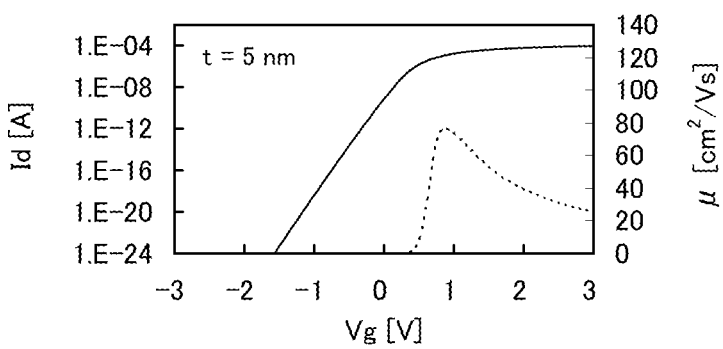

The other parameters used in calculation are as described above. For the calculation, device simulation software Sentaurus Device manufactured by Synopsys, Inc. was used. FIGS. 19A to 19C show the gate voltage ($V_g$: a potential difference between the gate and the source) dependence of the drain current ($I_d$, a solid line) and the mobility ($\mu$, a dotted line) of the transistor having the structure illustrated in FIG. 22A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility $\mu$ and the drain current $I_d$ (on-state current) in an on state. The graphs show that the drain current exceeds 10 μA at a gate voltage of around 1 V.

Figure 20A:
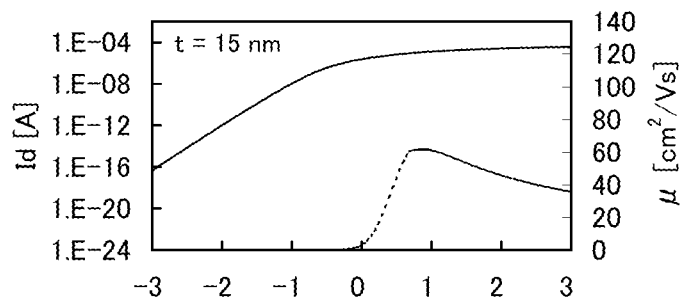
FIGS. 20A to 20C each show gate voltage dependence of drain current and mobility obtained by calculation.
Figure 20B:
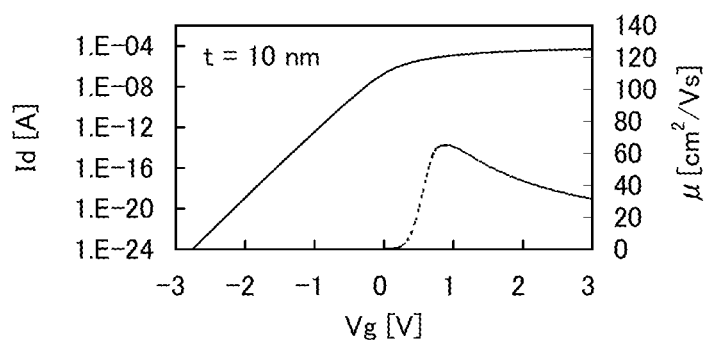
Figure 20C:
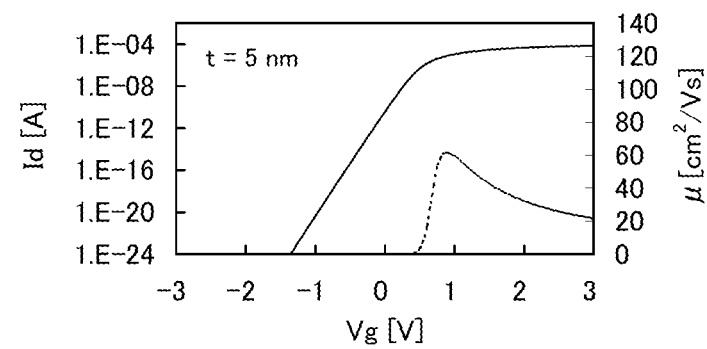

FIGS. 20A to 20C show the gate voltage $V_g$ dependence of the drain current $I_d$ (a solid line) and the mobility $\mu$ (a dotted line) of the transistor having the structure illustrated in FIG. 22B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 20A shows the gate voltage dependence of the transistor in the case where the thickness of the gate insulating film is 15 nm, FIG. 20B shows that of the transistor in the case where the thickness of the gate insulating film is 10 nm, and FIG. 20C shows that of the transistor in the case where the thickness of the gate insulating film is 5 nm.

Figure 21A:
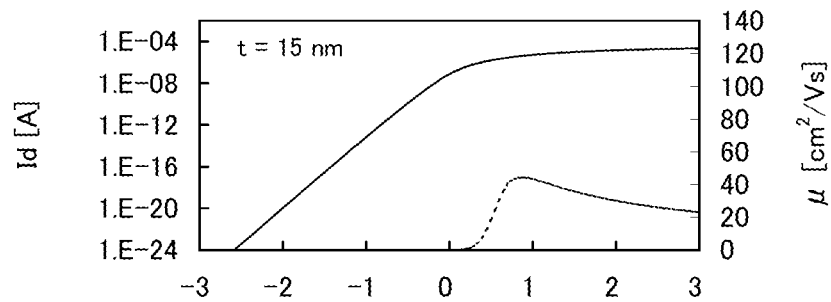
FIGS. 21A to 21C each show gate voltage dependence of drain current and mobility obtained by calculation.
Figure 21B:
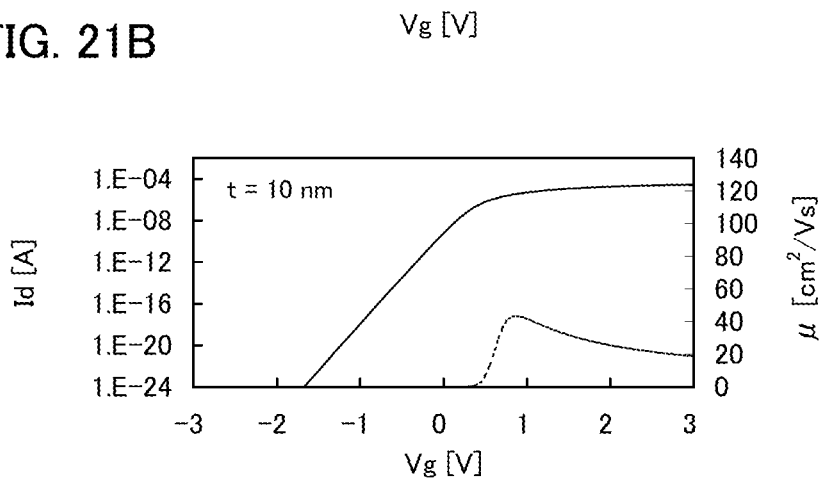
Figure 21C:
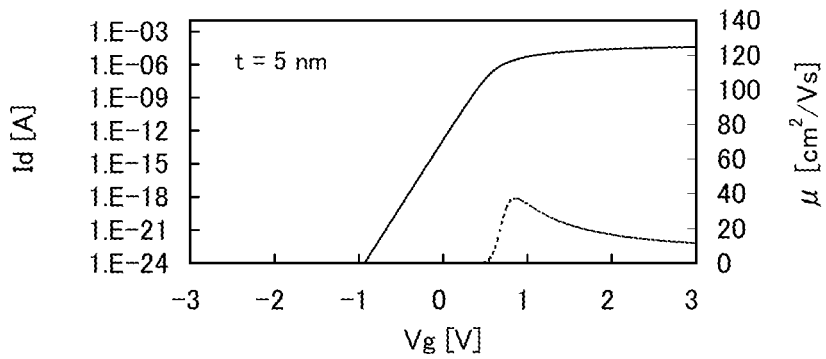
Figure 22A:
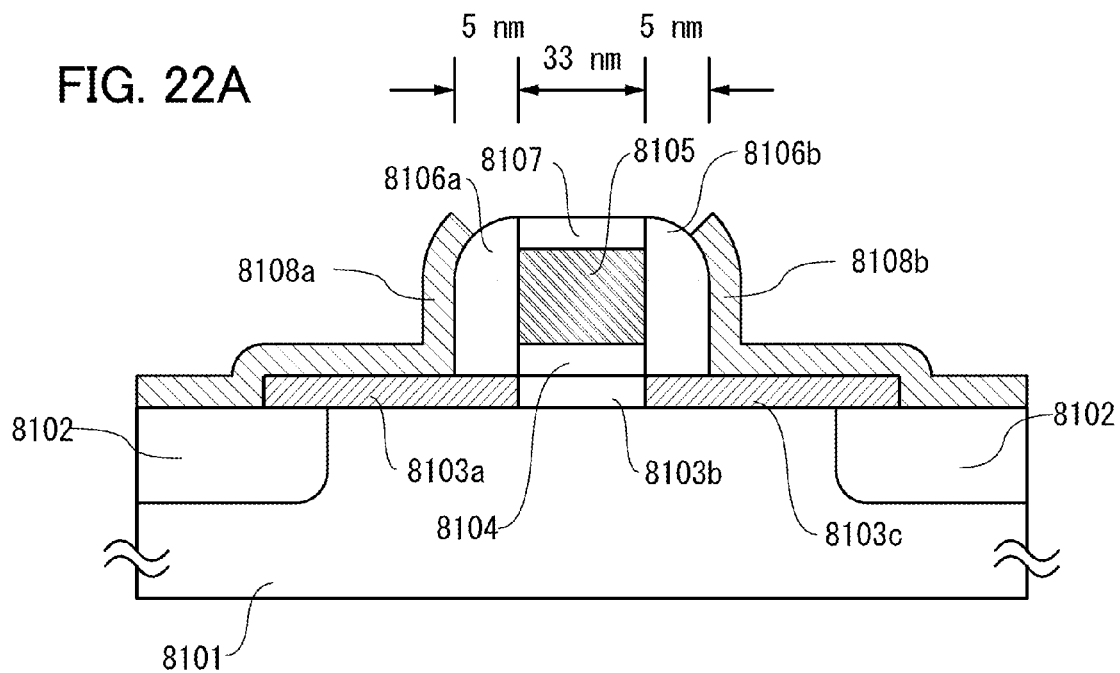
FIGS. 22A and 22B illustrate cross-sectional structures of transistors used for calculation.
Figure 22B:
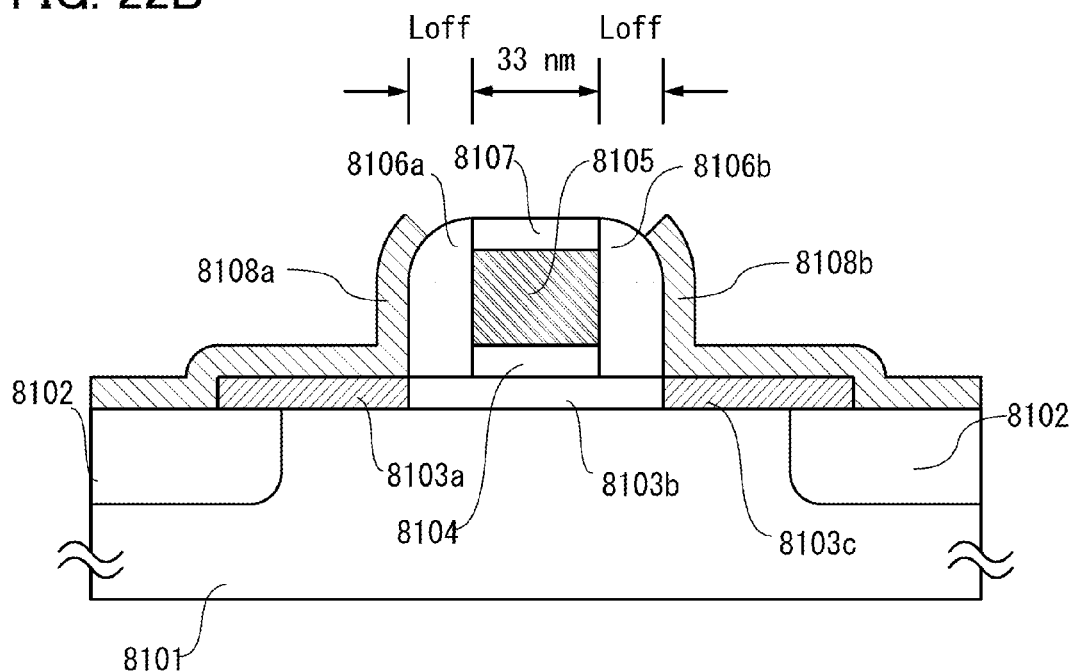

Further, FIGS. 21A to 21C show the gate voltage dependence of the drain current $I_d$ (a solid line) and the mobility $\mu$ (a dotted line) of the transistor having the structure illustrated in FIG. 22B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm²/Vs in FIGS. 19A to 19C, approximately 60 cm²/Vs in FIGS. 20A to 20C, and approximately 40 cm²/Vs in FIGS. 21A to 21C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

Embodiment 7

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 atomic % or more. Thus, in this embodiment, the case where the field-effect mobility of the transistor is improved by intentionally heating the substrate after formation of the oxide semiconductor film will be described with reference to FIGS. 23A to 23C, FIGS. 24A and 24B, FIGS. 25A and 25B, FIG. 26, FIGS. 27A and 27B, FIG. 28, and FIG. 29.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 23A:
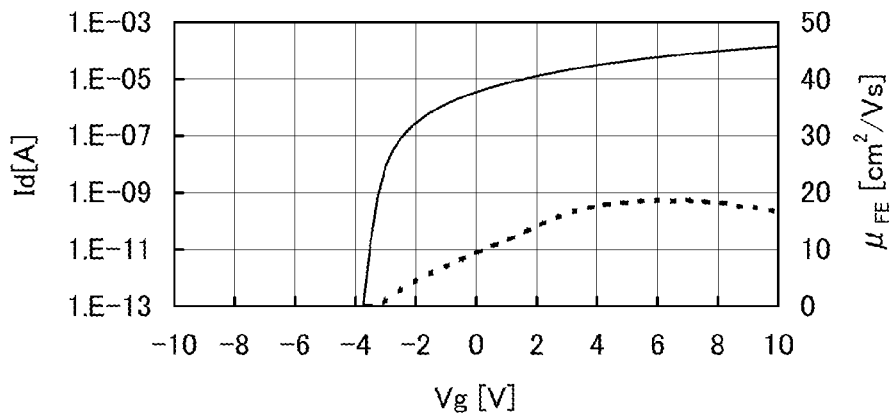
FIGS. 23A to 23C each show characteristics of a transistor.
Figure 23B:
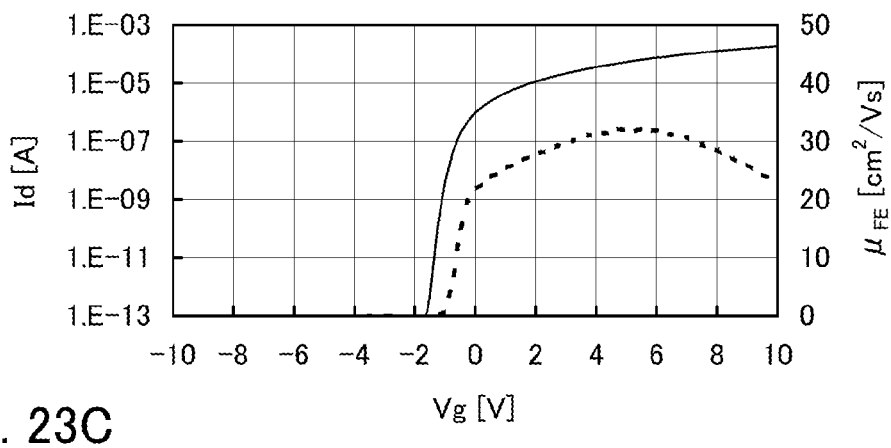
Figure 23C:
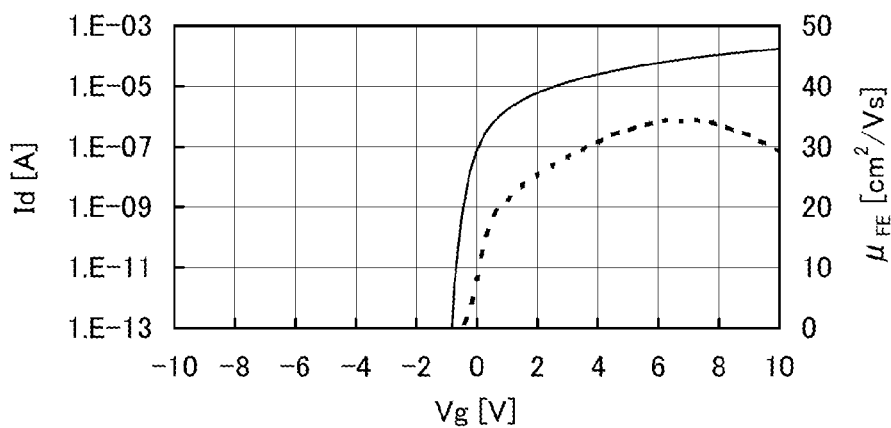

As an example, FIGS. 23A to 23C each show characteristics of a transistor in which an oxide semiconductor film including In, Sn, and Zn as main components and having a channel length L of 3 μm and a channel width W of 10 μm, and a gate insulating film with a thickness of 100 nm are used. Note that $V_d$ was set to 10 V.

FIG. 23A shows characteristics of a transistor whose oxide semiconductor film including In, Sn, and Zn as main components was formed by sputtering without heating a substrate intentionally. The field-effect mobility of the transistor is 18.8 cm²/Vsec. On the other hand, when the oxide semiconductor film including In, Sn, and Zn as main components is formed while heating the substrate intentionally, the field-effect mobility can be improved. FIG. 23B shows characteristics of a transistor whose oxide semiconductor film including In, Sn, and Zn as main components was formed while heating a substrate at 200° C. The field-effect mobility of the transistor is 32.2 cm²/Vsec.

The field-effect mobility can be further improved by performing heat treatment after formation of the oxide semiconductor film including In, Sn, and Zn as main components. FIG. 23C shows characteristics of a transistor whose oxide semiconductor film including In, Sn, and Zn as main components was formed by sputtering at 200° C. and then subjected to heat treatment at 650° C. The field-effect mobility of the transistor is 34.5 cm²/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to the gate insulating film was 2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating film was −2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a negative BT test.

Figure 24A:
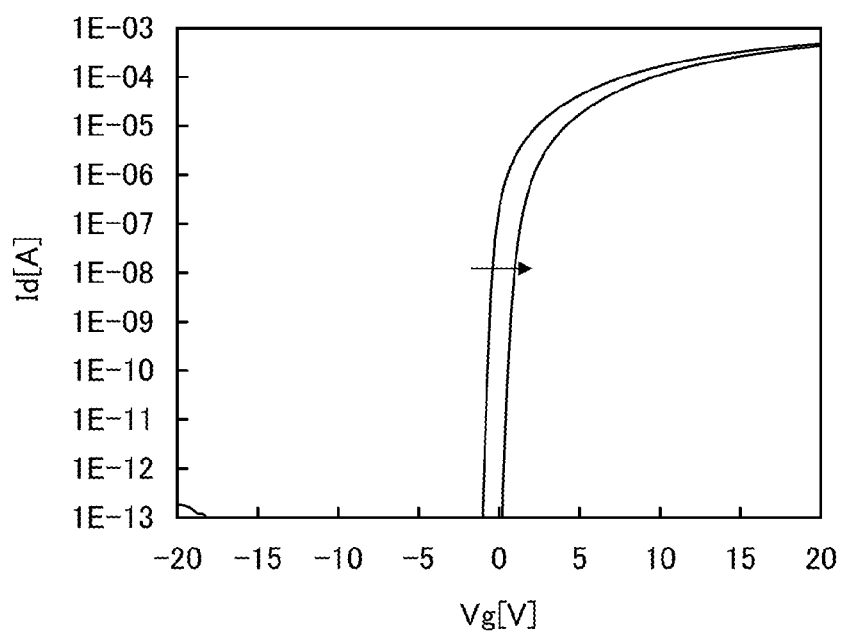
FIGS. 24A and 24B each show characteristics of a transistor.
Figure 24B:
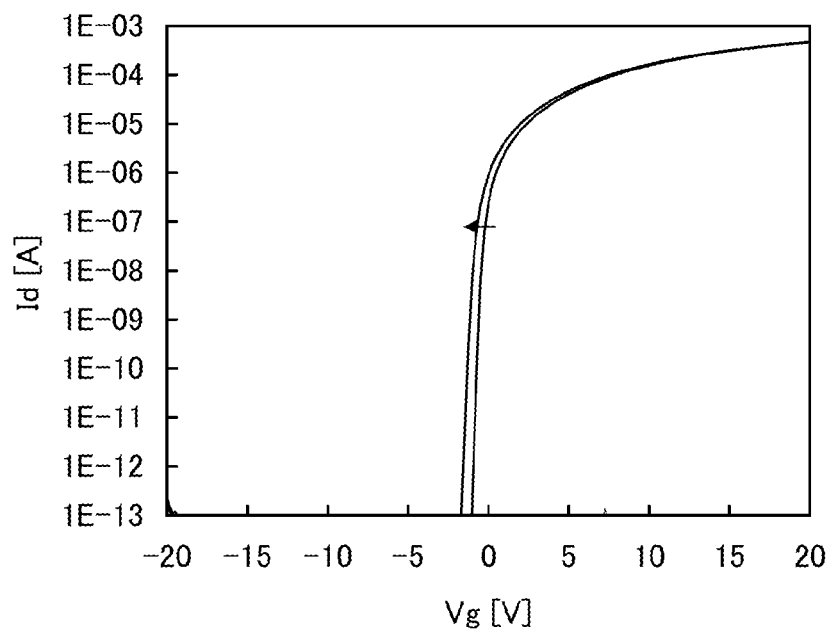
Figure 25A:
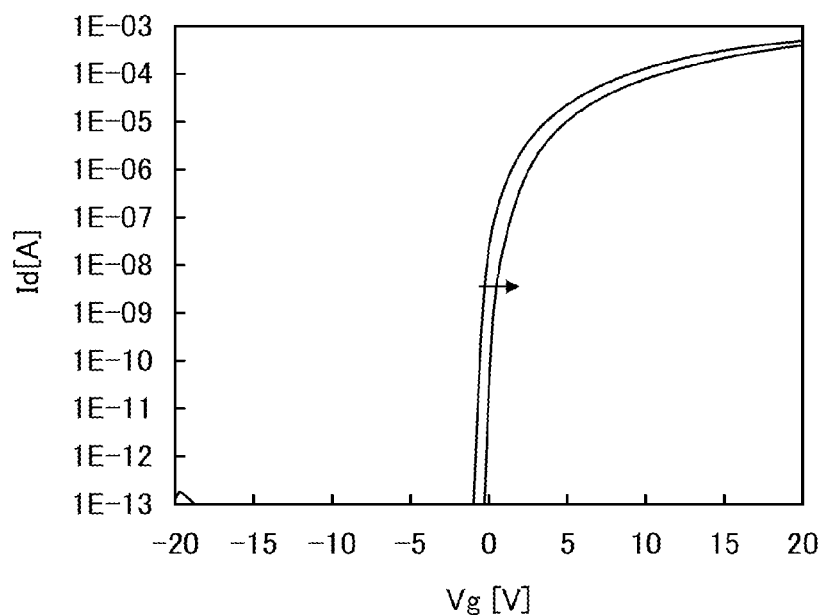
FIGS. 25A and 25B each show characteristics of a transistor.
Figure 25B:
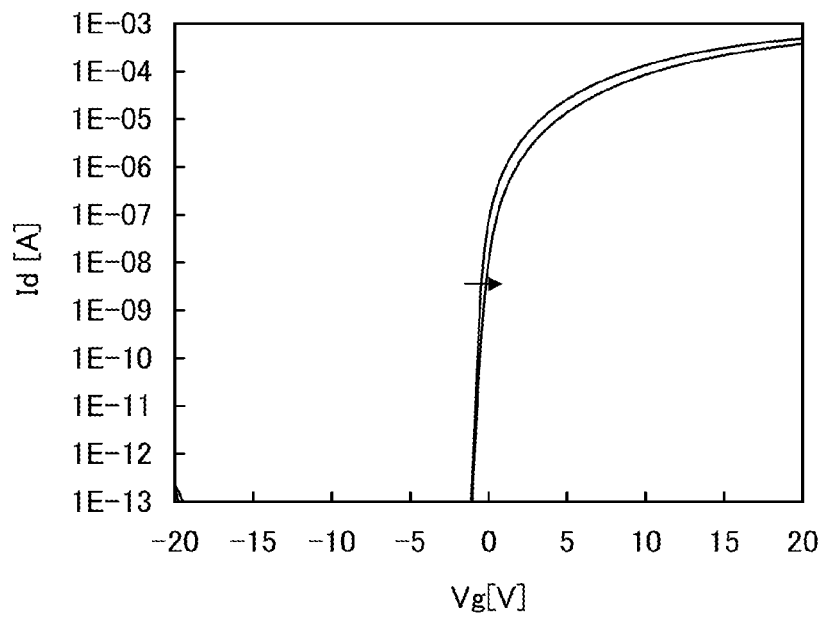

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
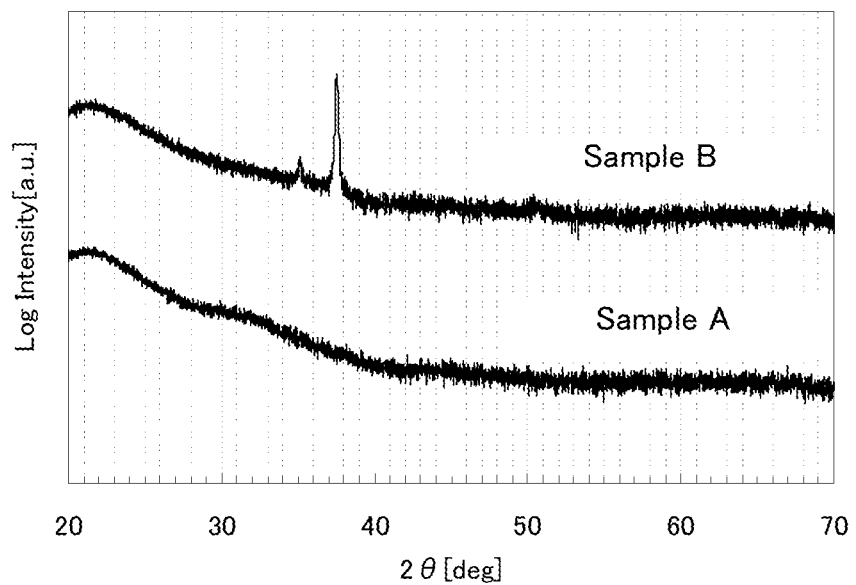
FIG. 28 shows XRD spectra of transistors.

FIG. 28 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 29:
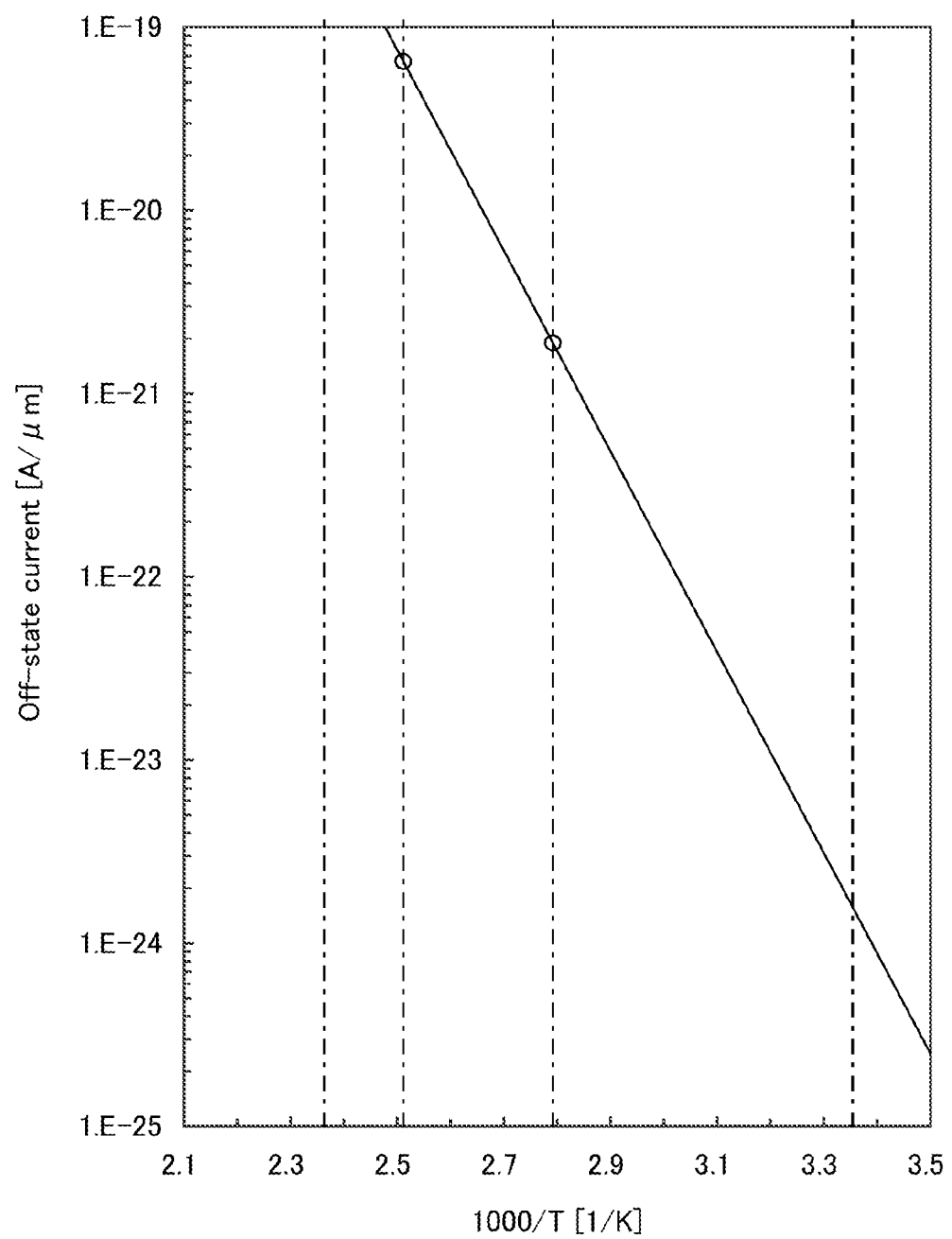
FIG. 29 shows characteristics of a transistor.

Specifically, as shown in FIG. 29, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of a sample, on which heat treatment at 650° C. was performed after formation of the oxide semiconductor film, was evaluated.

The transistor used for the measurement has a channel length L of 3 μm, a channel width W of 10 μm, Lov of 3 μm on one side (total Lov of 6 μm), and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 26:
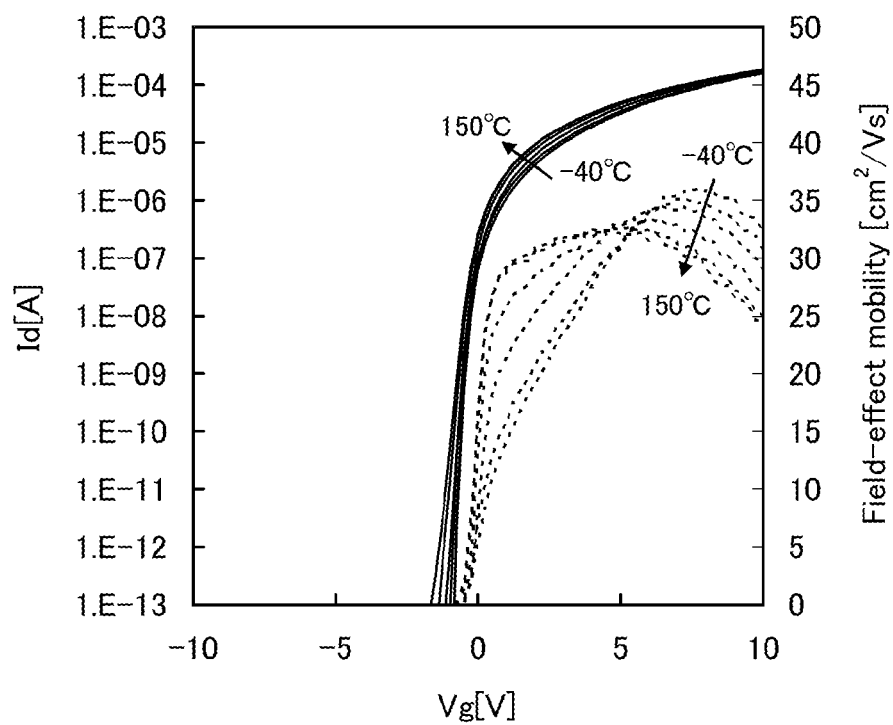
FIG. 26 shows characteristics of a transistor
Figure 27A:
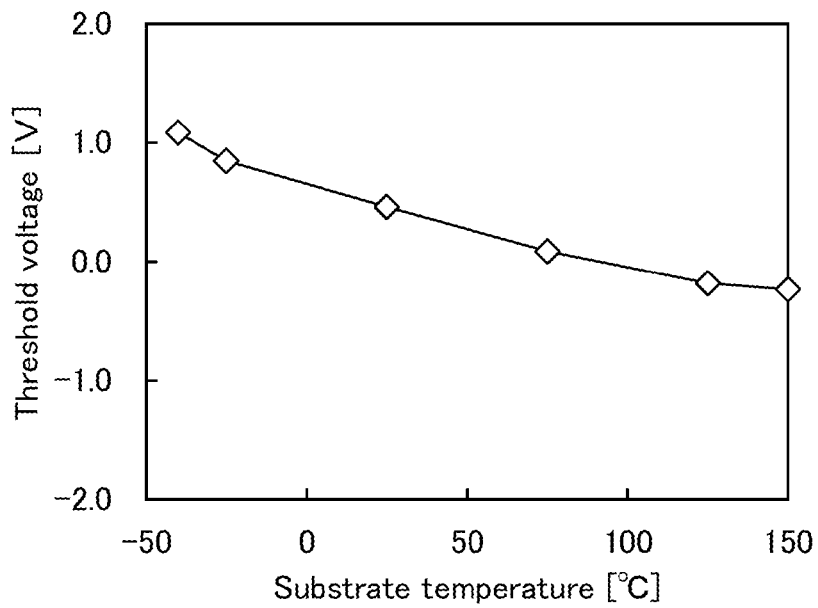
FIGS. 27A and 27B each show characteristics of a transistor.

FIG. 26 shows the $V_g$ dependence of $I_d$ (a solid line) and field-effect mobility (a dotted line). FIG. 27A shows a relation between the substrate temperature and the threshold voltage, and FIG. 27B shows a relation between the substrate temperature and the field-effect mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
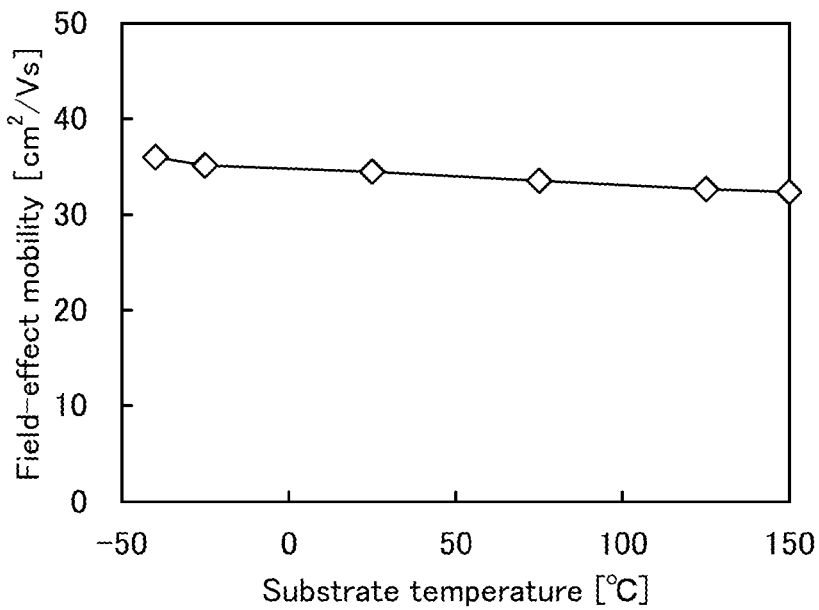

From FIG. 27B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Example 1

In this example, an example of a transistor in which an In—Sn—Zn—O film is used as an oxide semiconductor film will be described with reference to FIGS. 30A and 30B and the like.

Figure 30A:
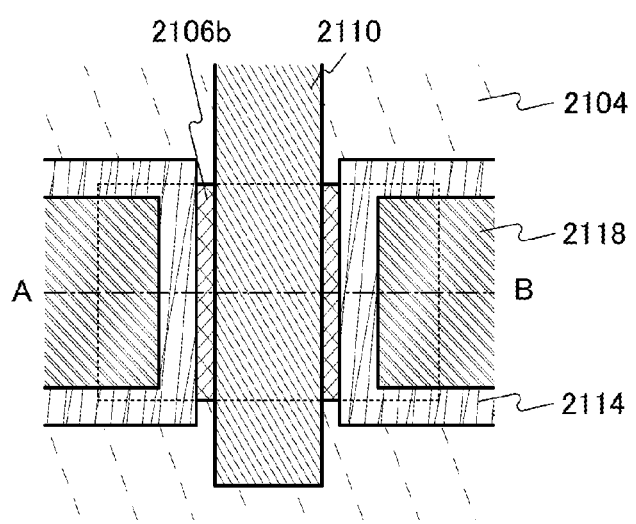
FIGS. 30A and 30B illustrate a structure of a transistor.
Figure 30B:
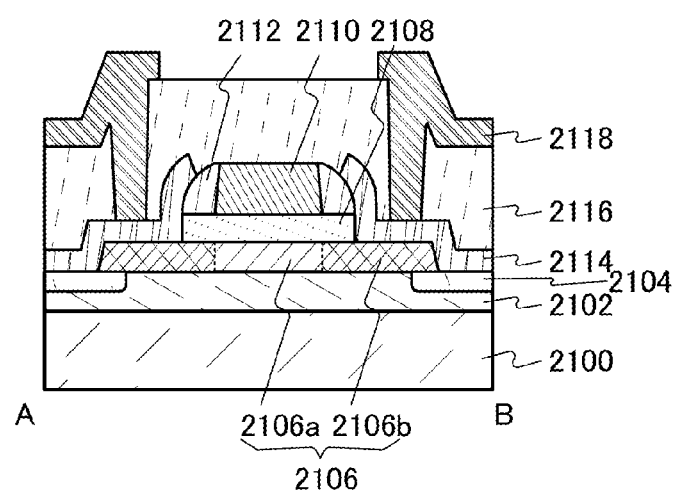

FIGS. 30A and 30B are a top view and a cross-sectional view of a coplanar transistor having a top-gate top-contact structure. FIG. 30A is the top view of the transistor. FIG. 30B illustrates cross section A-B along dashed-dotted line A-B in FIG. 30A.

The transistor illustrated in FIG. 30B includes a substrate 2100; a base insulating film 2102 provided over the substrate 2100; a protective insulating film 2104 provided in the periphery of the base insulating film 2102; an oxide semiconductor film 2106 which is provided over the base insulating film 2102 and the protective insulating film 2104 and includes a high-resistance region 2106a and a low-resistance region 2106b; a gate insulating film 2108 provided over the oxide semiconductor film 2106; a gate electrode 2110 provided to overlap with the oxide semiconductor film 2106 with the gate insulating film 2108 provided therebetween; a sidewall insulating film 2112 provided in contact with a side surface of the gate electrode 2110; a pair of electrodes 2114 provided in contact with at least the low-resistance region 2106b; an interlayer insulating film 2116 provided to cover at least the oxide semiconductor film 2106, the gate electrode 2110, and the pair of electrodes 2114; and a wiring 2118 provided to be connected to at least one of the pair of electrodes 2114 through an opening formed in the interlayer insulating film 2116.

Although not illustrated, a protective film may be provided to cover the interlayer insulating film 2116 and the wiring 2118. With the protective film, a minute amount of leakage current generated by surface conduction of the interlayer insulating film 2116 can be reduced and thus the off-state current of the transistor can be reduced.

Example 2

In this example, another example of a transistor in which an In—Sn—Zn—O film is used as an oxide semiconductor film will be described.

Figure 31A:
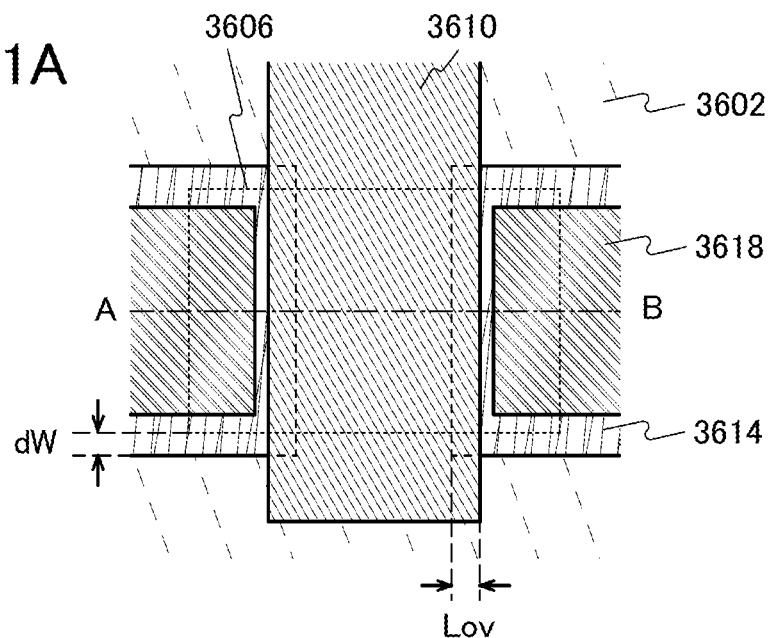
FIGS. 31A and 31B illustrate a structure of a transistor.
Figure 31B:
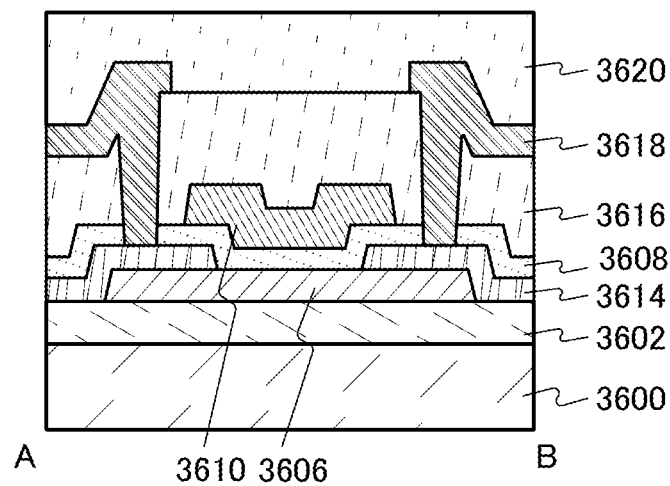

FIGS. 31A and 31B are a top view and a cross-sectional view which illustrate a structure of a transistor manufactured in this example. FIG. 31A is the top view of the transistor. FIG. 31B is a cross-sectional view along dashed-dotted line A-B in FIG. 31A.

The transistor illustrated in FIG. 31B includes a substrate 3600; a base insulating film 3602 provided over the substrate 3600; an oxide semiconductor film 3606 provided over the base insulating film 3602; a pair of electrodes 3614 in contact with the oxide semiconductor film 3606; a gate insulating film 3608 provided over the oxide semiconductor film 3606 and the pair of electrodes 3614; a gate electrode 3610 provided to overlap with the oxide semiconductor film 3606 with the gate insulating film 3608 provided therebetween; an interlayer insulating film 3616 provided to cover the gate insulating film 3608 and the gate electrode 3610; wirings 3618 connected to the pair of electrodes 3614 through openings formed in the interlayer insulating film 3616; and a protective film 3620 provided to cover the interlayer insulating film 3616 and the wirings 3618.

As the substrate 3600, a glass substrate can be used. As the base insulating film 3602, a silicon oxide film can be used. As the oxide semiconductor film 3606, an In—Sn—Zn—O film can be used. As the pair of electrodes 3614, a tungsten film can be used. As the gate insulating film 3608, a silicon oxide film can be used. The gate electrode 3610 can have a stacked structure of a tantalum nitride film and a tungsten film. The interlayer insulating film 3616 can have a stacked structure of a silicon oxynitride film and a polyimide film. The wirings 3618 can each have a stacked structure in which a titanium film, an aluminum film, and a titanium film are formed in this order. As the protective film 3620, a polyimide film can be used.

Note that in the transistor having the structure illustrated in FIG. 31A, the width of a portion where the gate electrode 3610 overlaps with one of the pair of electrodes 3614 is referred to as Lov. Similarly, the width of a portion of the pair of electrodes 3614, which does not overlap with the oxide semiconductor film 3606, is referred to as dW.

Example 3

The light-emitting device according to one embodiment of the present invention can be used for image light emitting devices, laptop personal computers, or image reproducing devices provided with recording media (typically devices which reproduce the content of recording media such as digital versatile discs (DVDs) and have displays for displaying the reproduced images). Other examples of electronic devices that can include the light-emitting device according to one embodiment of the present invention are mobile phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 14A to 14C.

Figure 14A:
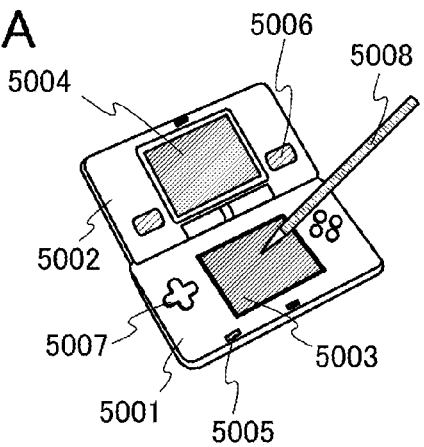
FIGS. 14A to 14C each illustrate an electronic device.

FIG. 14A illustrates a portable game machine, which includes a housing 5001, a housing 5002, an image display portion 5003, an image display portion 5004, a microphone 5005, speakers 5006, an operation key 5007, a stylus 5008, and the like. The light-emitting device according to one embodiment of the present invention can be used as the image display portion 5003 or the image display portion 5004. With the light-emitting device according to one embodiment of the present invention applied to the image display portion 5003 or the image display portion 5004, a portable game machine with high image quality can be provided. Note that although the portable game machine illustrated in FIG. 14A has the two image display portions 5003 and 5004, the number of image display portions included in a portable game machine is not limited to this.

Figure 14B:
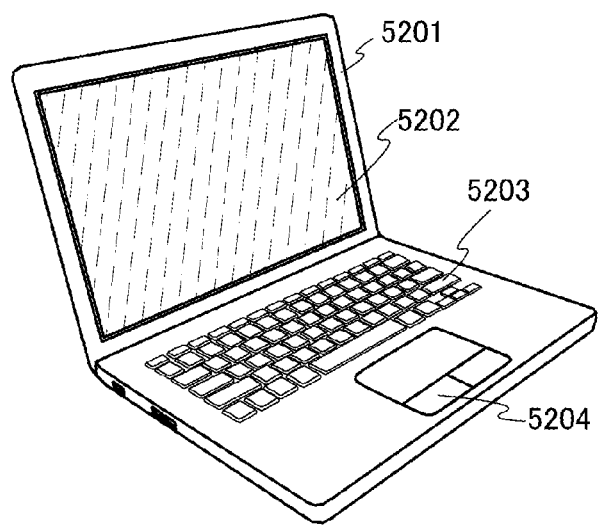

FIG. 14B illustrates a laptop personal computer including a housing 5201, an image display portion 5202, a keyboard 5203, a pointing device 5204, and the like. The light-emitting device according to one embodiment of the present invention can be used for the image display portion 5202. With the light-emitting device according to one embodiment of the present invention applied to the image display portion 5202, a laptop personal computer with high image quality can be provided.

Figure 14C:
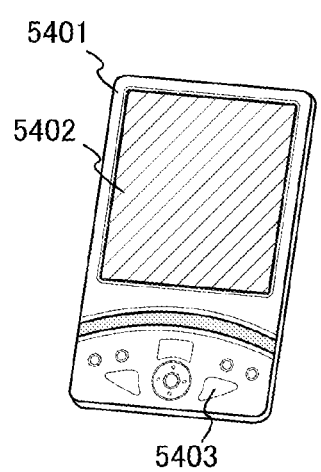

FIG. 14C illustrates a personal digital assistant including a housing 5401, an image display portion 5402, operation keys 5403, and the like. The light-emitting device according to one embodiment of the present invention can be used as the image display portion 5402. With the light-emitting device according to one embodiment of the present invention applied to the image display portion 5402, a personal digital assistant with high image quality can be provided.

As described above, the application range of the present invention is extremely wide and the present invention can be applied to electronic devices in a variety of fields.

This example can be implemented in appropriate combination with any of the above embodiments.

This application is based on Japanese Patent Application serial no. 2011-081923 filed with Japan Patent Office on Apr. 1, 2011, Japanese Patent Application serial no. 2011-081928 filed with Japan Patent Office on Apr. 1, 2011, Japanese Patent Application serial no. 2011-108587 filed with Japan Patent Office on May 13, 2011, and Japanese Patent Application serial no. 2011-108610 filed with Japan Patent Office on May 13, 2011, the entire contents of which are hereby incorporated by reference.

What is claimed is:

1. A light-emitting device comprising:
   a light-emitting element;
   a first transistor whose first terminal is electrically connected to a first terminal of the light-emitting element and whose second terminal is electrically connected to a first line;
   a second transistor whose first terminal is electrically connected to a gate of the first transistor and whose second terminal is electrically connected to a second line;
   a third transistor whose first terminal is electrically connected to the second terminal of the first transistor and whose second terminal is electrically connected to the gate of the first transistor;

a fourth transistor whose first terminal is electrically connected to the first terminal of the light-emitting element and whose second terminal is electrically connected to a third line;

a first capacitor whose first terminal is electrically connected to the gate of the first transistor and whose second terminal is electrically connected to the first terminal of the light-emitting element; and a second capacitor whose first terminal is electrically connected to the first terminal of the light-emitting element, wherein a second terminal of the second capacitor is electrically connected to the third line, and wherein the first to third transistors are n-channel transistors.

2. The light-emitting device according to claim 1, further comprising:

a fifth transistor between the first line and the second terminal of the first transistor, wherein a first terminal of the fifth transistor is electrically connected to the first line and a second terminal of the fifth transistor is electrically connected to the second terminal of the first transistor.

3. The light-emitting device according to claim 1, wherein a channel formation region of each of the first to third transistors comprises an oxide semiconductor.

4. The light-emitting device according to claim 1, wherein a channel formation region of the first transistor comprises an oxide semiconductor.

5. The light-emitting device according to claim 1, wherein a channel formation region of the first transistor comprises an In—Ga—Zn-based oxide semiconductor.

6. The light-emitting device according to claim 1, wherein a channel formation region of each of the first to third transistors comprises single crystal silicon.

7. The light-emitting device according to claim 1,
wherein the first terminal of the light-emitting element is an anode, and
wherein the second terminal of the light-emitting element is a cathode.

8. The light-emitting device according to claim 1,
wherein the first line is a power supply line, and
wherein the second line is a signal line.

9. The light-emitting device according to claim 1, further comprising a circuit board electrically connected to a display portion that comprises the light-emitting element.

10. A light-emitting device comprising:
a light-emitting element;
a first transistor whose source is electrically connected to an anode of the light-emitting element, the first transistor configured to control a current supplied to the light-emitting element;
a second transistor configured to control whether an image signal is input to a gate of the first transistor;
a third transistor configured to control electrical connection and disconnection between the gate and a drain of the first transistor;
a fourth transistor configured to control whether a first power supply potential is supplied to the drain of the first transistor;
a fifth transistor configured to control whether a second power supply potential is supplied to the anode of the light-emitting element;
a first capacitor configured to hold a voltage between the gate and the source of the first transistor; and a second capacitor electrically connected in series with the first capacitor and electrically connected in series with the light-emitting element, wherein the first to fifth transistors are n-channel transistors.

11. The light-emitting device according to claim 10, wherein a channel formation region between a source and a drain of each of the first to fifth transistors comprises an oxide semiconductor.

12. The light-emitting device according to claim 10, wherein a channel formation region of the first transistor comprises an In—Ga—Zn-based oxide semiconductor.

13. The light-emitting device according to claim 10, wherein a channel formation region between a source and a drain of each of the first to fifth transistors comprises single crystal silicon.

14. The light-emitting device according to claim 10, further comprising a circuit board electrically connected to a display portion that comprises the light-emitting element.

15. A light-emitting device comprising:
a light-emitting element;
a first transistor whose source is electrically connected to an anode of the light-emitting element, the first transistor configured to control a current supplied to the light-emitting element;
a second transistor configured to control whether an image signal is input to a gate of the first transistor;
a third transistor configured to control electrical connection and disconnection between a gate and a drain of the second transistor;
a fourth transistor configured to control whether a first power supply potential is supplied to the drain of the second transistor;
a fifth transistor configured to control whether a second power supply potential is supplied to the anode of the light-emitting element;
a sixth transistor configured to control whether the second power supply potential is supplied to the drain of the second transistor;
a first capacitor configured to hold a voltage between the gate and a source of the second transistor; and
a second capacitor electrically connected in series with the first capacitor and electrically connected in series with the light-emitting element, wherein the first to sixth transistors are n-channel transistors.

16. The light-emitting device according to claim 15, wherein a channel formation region between a source and a drain of each of the first to sixth transistors comprises an oxide semiconductor.

17. The light-emitting device according to claim 15, wherein a channel formation region of the first transistor comprises an In—Ga—Zn-based oxide semiconductor.

18. The light-emitting device according to claim 15, wherein a channel formation region between a source and a drain of each of the first to sixth transistors comprises single crystal silicon.

19. The light-emitting device according to claim 15, further comprising a circuit board electrically connected to a display portion that comprises the light-emitting element.

* * * * *